(12) United States Patent
Kim et al.

(10) Patent No.: US 12,167,656 B2
(45) Date of Patent: *Dec. 10, 2024

(54) DISPLAY PANEL AND DISPLAY DEVICE WITH SCAN LINE ELECTRICALLY CONNECTED TO ADJACENT SCAN LINE

(71) Applicant: Samsung Display Co., Ltd., Yongin-si (KR)

(72) Inventors: Hyeongseok Kim, Hwaseong-si (KR); Youngwan Seo, Suwon-si (KR); Junhyun Park, Suwon-si (KR); Yujin Lee, Suwon-si (KR); Cheol-Gon Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,825

(22) Filed: Jun. 7, 2023

(65) Prior Publication Data

US 2023/0320155 A1 Oct. 5, 2023

Related U.S. Application Data

(63) Continuation of application No. 17/028,152, filed on Sep. 22, 2020, now Pat. No. 11,706,957.

(30) Foreign Application Priority Data

Oct. 29, 2019 (KR) .................. 10-2019-0135825

(51) Int. Cl.
*H10K 59/131* (2023.01)
*H10K 59/35* (2023.01)

(52) U.S. Cl.
CPC .......... *H10K 59/131* (2023.02); *H10K 59/35* (2023.02)

(58) Field of Classification Search
CPC ... H01L 27/3276; H10K 59/131; H10K 59/35
See application file for complete search history.

(56) References Cited

U.S. PATENT DOCUMENTS 8,350,792 B2  1/2013 Igeta et al.
8,890,181 B2  11/2014 Wang et al.
(Continued)

FOREIGN PATENT DOCUMENTS

EP  3057085 A1  8/2016
EP  3176771 A2  6/2017
(Continued)

*Primary Examiner* — Lex H Malsawma
(74) *Attorney, Agent, or Firm* — CANTOR COLBURN LLP

(57) ABSTRACT

A display panel includes a first display area and a second display area. The display panel includes a plurality of first pixel groups in the first display area, a plurality of second pixel groups in the second display area, and a plurality of scan lines connected to the first and second pixel groups. The second display area includes a plurality of light emitting areas in which the second pixel groups are respectively disposed, and a plurality of open areas in which the second pixel groups are not disposed. One of a second pixel group of an n-th row is cut and does not overlap an adjacent open area of the n-th row, and is connected in the second display area to a scan line of a second pixel group of an (n−1)-th row or a scan line of a second pixel group of an (n+1)-th row.

20 Claims, 21 Drawing Sheets

(56) References Cited

U.S. PATENT DOCUMENTS

| | | |
|---|---|---|
| 9,853,096 B1 | 12/2017 | Choi et al. |
| 10,964,771 B2 | 3/2021 | Lee et al. |
| 2008/0117497 A1 | 5/2008 | Shimodaira |
| 2009/0051636 A1 | 2/2009 | Natori |
| 2016/0078803 A1 | 3/2016 | Kim |
| 2018/0129328 A1 | 5/2018 | Park et al. |
| 2019/0013368 A1 | 1/2019 | Chung et al. |
| 2019/0056822 A1 | 2/2019 | Lee et al. |
| 2019/0115415 A1 | 4/2019 | Choi et al. |
| 2019/0130822 A1 | 5/2019 | Jung et al. |
| 2019/0362678 A1 | 11/2019 | Shin et al. |
| 2021/0013298 A1 | 1/2021 | Her et al. |
| 2021/0126080 A1* | 4/2021 | Kim .................... H10K 59/131 |

FOREIGN PATENT DOCUMENTS

| | | |
|---|---|---|
| EP | 3680888 A1 | 7/2020 |
| EP | 3745463 A2 | 12/2020 |
| EP | 3770896 A1 | 1/2021 |
| KR | 1020170113066 A | 10/2017 |
| KR | 1020190041553 A | 4/2019 |

\* cited by examiner

DISPLAY PANEL AND DISPLAY DEVICE WITH SCAN LINE ELECTRICALLY CONNECTED TO ADJACENT SCAN LINE

This application is a continuation of U.S. patent application Ser. No. 17/028,152, filed on Sep. 22, 2020, which claims priority to Korean Patent Application No. 10-2019-0135825, filed on Oct. 29, 2019, and all the benefits accruing therefrom under 35 U.S.C. § 119, the content of which in its entirety is herein incorporated by reference.

BACKGROUND

1. Field

The disclosure herein relates to a display panel and a display device, and more particularly, to a display device having improved sensing sensitivity of an electronic module.

2. Description of the Related Art

A display device may include various electronic components such as a display panel for displaying an image, an input sensing member for sensing an external input, and an electronic module. The electronic components may be electrically connected to each other by signal lines arranged in various ways. The display panel includes a light emitting element for generating light.

The input sensing member may include sensing electrodes for sensing an external input. The electronic module may include a camera, an infrared sensor, a proximity sensor, or the like. The electronic module may be disposed below the display panel.

SUMMARY

The disclosure provides a display panel with improve sensing sensitivity of an electronic module, and a display device including the display panel.

In an embodiment of the invention, a display panel includes a first display area having a first light transmittance value and a second display area having a second light transmittance value higher than the first light transmittance value. In such an embodiment, the display panel includes a plurality of first pixel groups in the first display area, where each of the plurality of first pixel groups includes a first pixel, a plurality of second pixel groups in the second display area, wherein each of the plurality of second pixel groups includes a second pixel, and a plurality of scan lines of the plurality of first pixel groups and the plurality of second pixel groups.

In such an embodiment, the second display area includes a plurality of light emitting areas in which the plurality of second pixel groups are respectively disposed, and a plurality of open areas in which the second pixel groups are not disposed.

In such an embodiment, a scan line of a second pixel group of an n-th row among the plurality of second pixel groups is cut and does not overlap an open area of the n-th row adjacent to the second pixel group, and is connected in the second display area to a scan line of a second pixel group of an (n−1)-th row or a scan line of a second pixel group of an (n+1)-th row.

In an embodiment of the invention, a display device includes a display panel and an electronic module. In such an embodiment, the display panel includes a first display area having a first resolution value, a second display area having a second resolution value lower than the first resolution value, a plurality of first pixel groups in the first display area, where each of the plurality of first pixel groups includes a first pixel, a plurality of second pixel groups in the second display area, where each of the plurality of pixel groups includes a second pixel, and a plurality of scan lines connected to the plurality of first pixel groups and the plurality of second pixel groups. In such an embodiment, the electronic module is disposed below the second display area.

In such an embodiment, the second display area includes a plurality of light emitting areas in which second pixels are disposed, and a plurality of open areas in which first pixels and the second pixels are not disposed.

In such an embodiment, one of the scan lines of a second pixel group of an n-th row among the plurality of second pixel groups is cut and does not overlap an open area of the n-th row adjacent to the second pixel group, and is connected in the second display area to a scan line of a second pixel group of an (n−1)-th row or a scan line of a second pixel group of an (n+1)-th row.

BRIEF DESCRIPTION OF THE FIGURES

The accompanying drawings are included to provide a further understanding of the invention, and are incorporated in and constitute a part of this specification. The drawings illustrate exemplary embodiments of the invention and, together with the description, serve to describe principles of the invention. In the drawings.

DETAILED DESCRIPTION

Figure 1A:
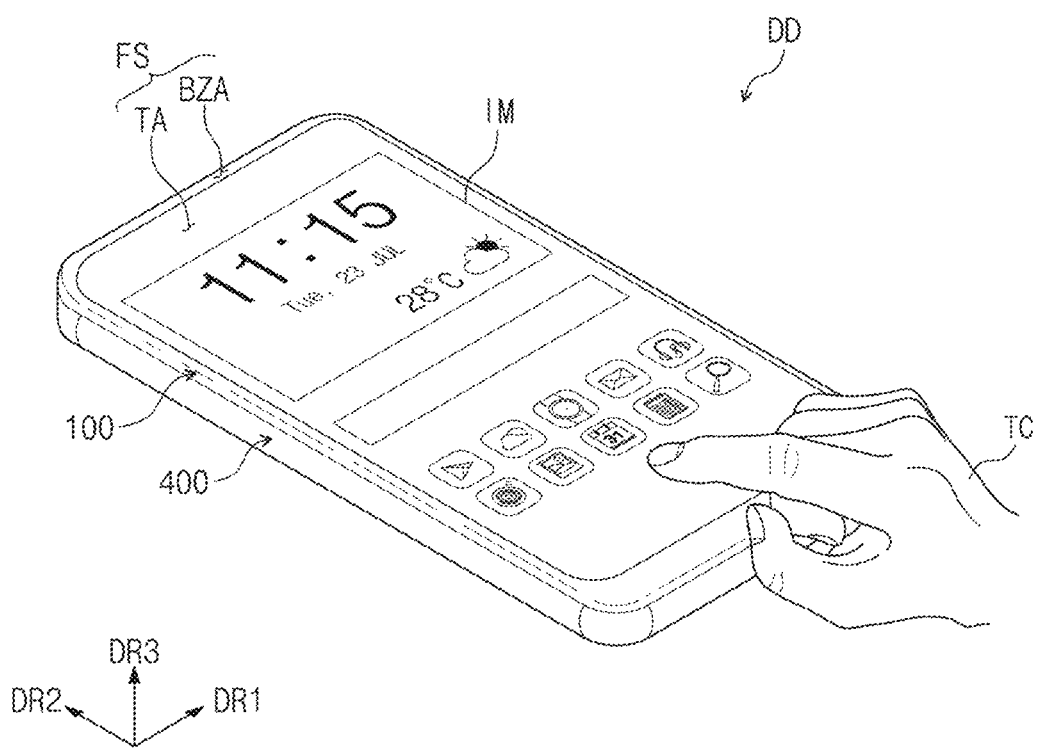
FIG. 1A a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on", "connected to" or "coupled to" another element or layer, it can be directly on, connected directly to or coupled directly to the other element or layer, or intervening elements or layers may be present. In contrast, when an element is referred to as being "directly on"", "connected directly to", or "coupled directly to" another element, there are no intervening elements present.

Like reference numerals refer to like elements throughout this specification. In the figures, the thicknesses, ratios and dimensions of elements are exaggerated for effective description of the technical contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
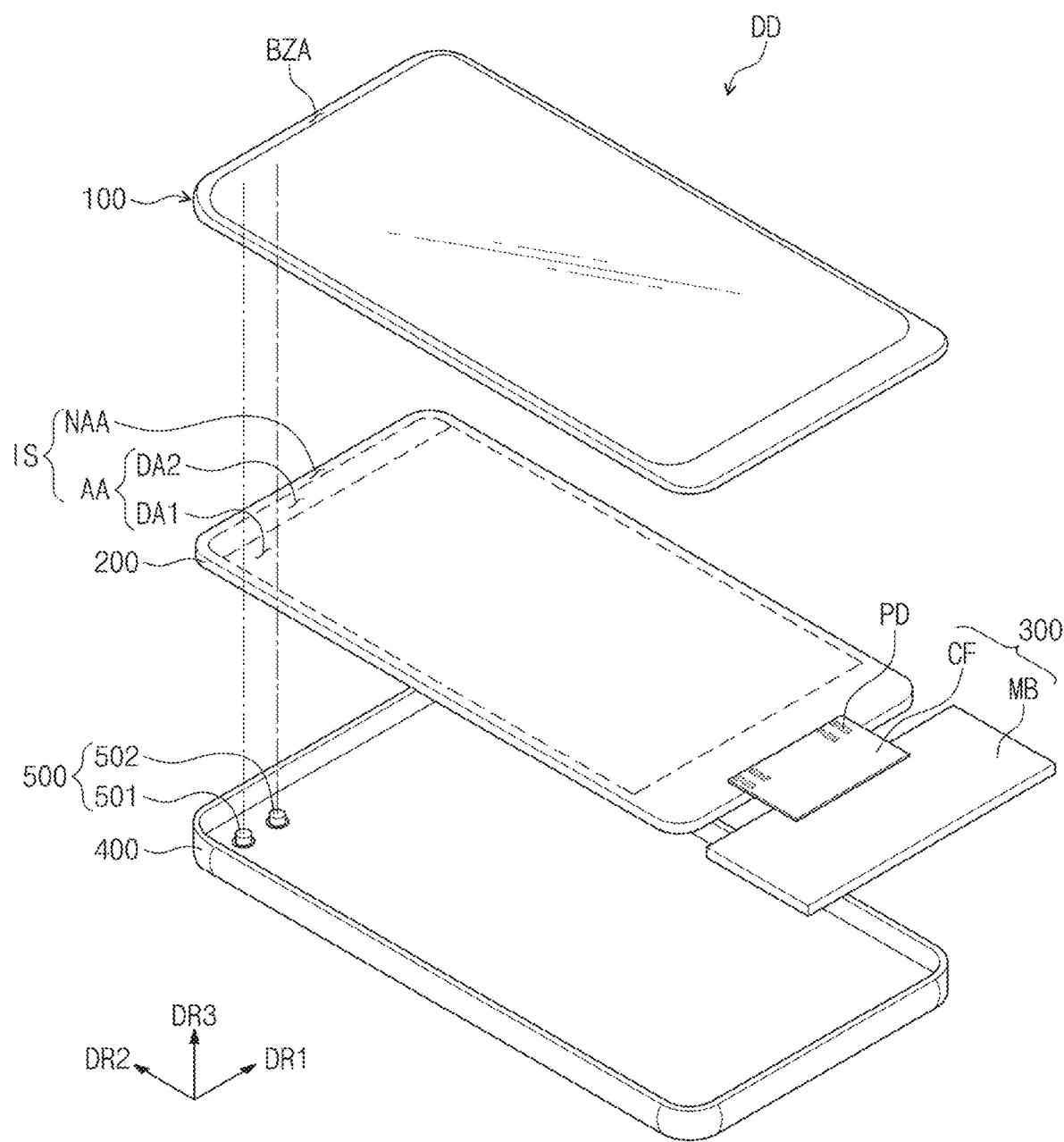
FIG. 1B is an exploded perspective view of a display device according to an embodiment of the invention.
Figure 2:
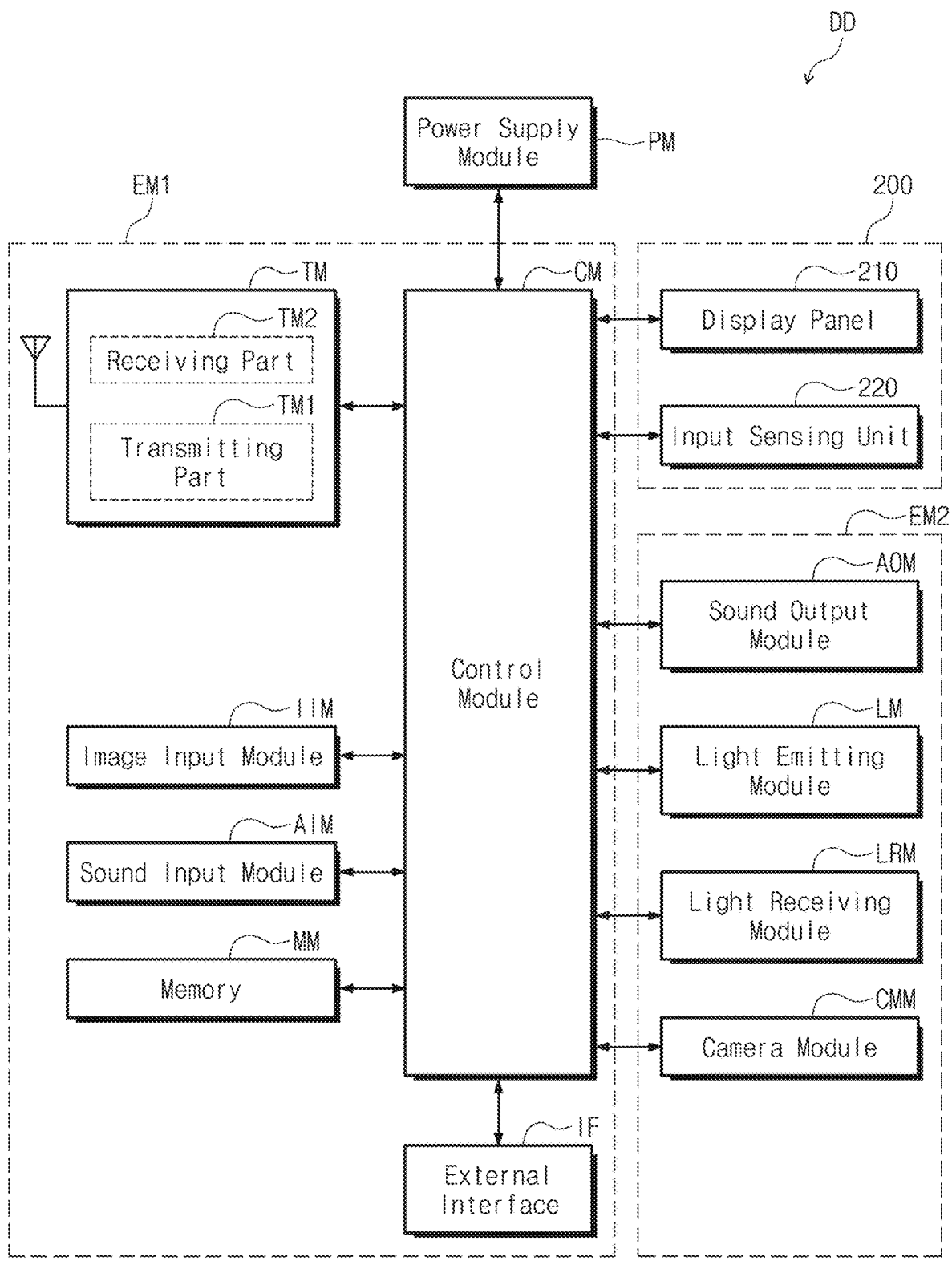
FIG. 2 is a block diagram of a display device according to an embodiment of the invention.

FIG. 1A a perspective view of a display device according to an embodiment of the invention. FIG. 1B is an exploded perspective view of a display device according to an embodiment of the invention. FIG. 2 is a block diagram of a display device according to an embodiment of the invention.

Referring to FIGS. 1A, 1B, and 2, an embodiment of a display device DD may be a device that is activated according to an electrical signal. The display device DD may include various devices, for example, a tablet computer, a laptop computer, a personal computer, a television, or the like. Hereinafter, for convenience of description, embodiments where the display device DD is a smartphone will be described in detail.

The display device DD may display an image IM toward a third direction DR3 on a display surface FS parallel to a first direction DR1 and a second direction DR2 crossing (or perpendicular to) the first direction DR1. The display surface FS, on which the image IM is displayed, may correspond to a front surface of the display device DD and a front surface FS of a window 100. Hereinafter, the display surface and the front surface of the display device DD, and the front surface of the window 100 may be indicated by a same reference numeral FS. The image IM may include a still image in addition to a dynamic image. In an embodiment, the image IM may include a watch window and application icons as illustrated in FIG. 1A.

In such an embodiment, a front surface (or a top surface) and a rear surface (or a bottom surface) of each member are defined in relation to a direction in which the image IM is displayed. The front surface and the rear surface may be opposed to each other in the third direction DR3, and a normal direction of each of the front surface and the rear surface may be parallel to the third direction DR3. Herein, directions indicated by the first to third directions DR1 to DR3 are relative and may be converted into different directions.

In an embodiment, as shown in FIG. 1B, the display device DD may include the window 100, a display module 200, a driving circuit unit 300, a housing 400, and electronic modules 500. In such an embodiment, the window 100 and the housing 400 may be combined to form the appearance of the display device DD.

The window 100 may include an optically clear insulating material. In one embodiment, for example, the window 100 may include a glass or a plastic. The window 100 may have a multilayer structure or a single layer structure. In one embodiment, for example, the window 100 may include a plurality of plastic films bonded to each other by an adhesive, or may include a glass substrate and a plastic film bonded to each other by an adhesive.

When viewed in a plane, the window 100 may be divided into a transmissive area TA and a bezel area BZA. Herein, the phrase "when viewed in a plane" may mean a case of viewing from a plan view in the third direction DR3. Further, a "thickness direction" may mean the third direction DR3.

The transmissive area TA may be an optically clear area. The bezel area BZA may be an area having lower light transmittance when compared with the transmissive area TA. The bezel area BZA may define the shape of the transmissive area TA. The bezel area BZA may be adjacent to and surround the transmissive area TA.

The bezel area BZA may have a predetermined color. The bezel area BZA may cover a peripheral area NAA of the display module 200 to block the peripheral area NAA from being viewed from the outside. In an alternative embodiment, the bezel area BZA may be omitted in the window 100.

The display module 200 may be disposed below the window 100. Herein, "below" may mean a direction opposite to a direction in which the display module 200 provides an image, or a direction opposite to the third direction DR3. The display module 200 may display the image IM and sense an external input TC. The display module 200 includes a front surface IS including an active area AA and the peripheral area NAA. The active area AA may be an area that is activated according to an electrical signal.

In an embodiment, the active area AA may be an area where the image IM is displayed and where the external input TC is sensed. The transmissive area TA overlaps at least the active area AA. In one embodiment, for example, the transmissive area TA overlaps the entirety of or at least a portion of the active area AA. Accordingly, a user may view the image IM or provide the external input TC through the transmissive area TA.

The peripheral area NAA may be an area covered by the bezel area BZA. The peripheral area NAA is adjacent to the active area AA. The peripheral area NAA may surround the active area AA. A driving circuit, a driving wire or the like for driving the active area AA may be disposed in the peripheral area NAA.

In an embodiment, the display module 200 is assembled in a flat state in which the active area AA and the peripheral area NAA face the window 100. However, this is merely exemplarily, and alternatively, a portion of the peripheral area NAA may be bent. In such an embodiment, the portion of the peripheral area NAA may be bent to face a rear surface of the display device DD, and thus the surface area of the bezel area BZA may be reduced on the front surface of the display device DD. Alternatively, the display module 200 may be assembled in a state in which a portion of the active area AA is bent. Alternatively, the peripheral area NAA may be omitted in the display module 200.

The active area AA of the display module 200 may include a plurality of display areas. The plurality of display areas may have values of light transmittance different from each other. In an embodiment of the invention, as shown in FIG. 1B, the active area AA of the display module 200 includes a first display area DA1 and a second display area DA2. The second display area DA2 may have higher light transmittance than the first display area DA1.

The driving circuit unit 300 may be electrically connected to the display module 200. The driving circuit unit 300 may include a main circuit board MB and a flexible film CF.

The flexible film CF is electrically connected to the display module 200. The flexible film CF may be connected to pads PD of the display module 200 disposed in the peripheral area NAA. The flexible film CF provides the display module 200 with an electrical signal for driving the display module 200. The electrical signal may be generated in the flexible film CF or in the main circuit board MB. The main circuit board MB may include various driving circuits for driving the display module 200, a connector for supplying power, or the like.

The electronic modules 500 may include a first electronic module 501 and a second electronic module 502. When viewed in a plane, the first and second electronic modules 501 and 502 may overlap the second display area DA2. The first and second electronic modules 501 and 502 may be disposed below the display module 200. The first and second electronic modules 501 and 502 may receive an external input transmitted through the second display area DA2, or output a signal through the second display area DA2. In such an embodiment, as described above, the second display area DA2 has higher light transmittance than the first display area DA1, such that the electronic modules 500 may effectively transmit and/or receive signals through the second display area DA2.

The housing 400 is combined with the window 100. The housing 400 is combined with the window 100 to provide an internal space. The display module 200 and the electronic modules 500 may be accommodated in the internal space.

The housing 400 may include a material having a relatively high rigidity. In one embodiment, for example, the housing 400 may include a glass, a plastic, a metal, or a plurality of frames and/or plates constituted of a combination thereof. The housing 400 may securely protect the components of the display device DD accommodated in the internal space from external impact.

Referring to FIG. 2, the display device DD may include the display module 200, a power supply module PM, a first electronic module EM1, and a second electronic module EM2. The display module 200, the power supply module PM, the first electronic module EM1, and the second electronic module EM2 may be electrically connected to each other.

The display module 200 may include a display panel 210 and an input sensing unit 220.

The display panel 210 may be a component that substantially generates the image IM. The image IM generated by the display panel 210 is displayed on the front surface IS and is viewed by a user from the outside through the transmissive area TA.

The input sensing unit 220 senses the external input TC applied from the outside. In one embodiment, for example, the input sensing unit 220 may sense the external input TC provided to the window 100. The external input TC may be a user input. The user input includes various types of external inputs such as a touch by a part of a user's body, light, heat, a pen, and a pressure. In an embodiment, as shown in FIG. 1A, the external input TC may be a touch by a user's hand on the front surface FS. However, this is merely exemplarily, and the external input TC may be provided in various forms as described above. In an embodiment, the input sensing unit 220 may sense, according to the structure of the display device DD, the external input TC applied to a side surface or a rear surface of the display device DD, but not being limited thereto.

The power supply module PM supplies power used for the overall operation of the display device DD. The power supply module PM may include a battery module.

The first electronic module EM1 and the second electronic module EM2 may include various functional modules for operating the display device DD.

The first electronic module EM1 may be mounted directly on a motherboard electrically connected to the display module 200, or may be mounted on a separate board to be electrically connected to the motherboard through a connector (not illustrated) or the like.

The first electronic module EM1 may include a control module CM, a wireless communication module TM, an image input module IIM, a sound input module AIM, a memory MM, and an external interface IF. Some of the modules described above may not be mounted on the motherboard, but may be electrically connected to the motherboard through a flexible circuit board.

The control module CM controls the overall operation of the display device DD. The control module CM may be a microprocessor. In one embodiment, for example, the control module CM activates or deactivates the display module 200. The control module CM may control other modules such as the image input module IIM and the sound input module AIM based on a touch signal received from the display module 200.

The wireless communication module TM may transmit/receive a radio signal to/from another terminal using a Bluetooth or Wi-Fi channel. The wireless communication module TM may transmit/receive a voice signal using a general communication channel. The wireless communication module TM may include a transmitting part TM1 for modulating and transmitting a signal to be transmitted, and a receiving part TM2 for demodulating a received signal.

The image input module IIM processes an image signal and converts the processed image signal into image data to be displayed on the display module 200. The sound input module AIM receives an external sound signal using a microphone in a recording mode, a voice recognition mode, or the like, and converts the received external sound signal into electrical voice data.

The external interface IF may serve as an interface to which an external charger, a wired/wireless data port, a card socket (e.g., a memory card and a SIM/UIM card), or the like are connected.

The second electronic module EM2 may include a sound output module AOM, a light emitting module LM, a light receiving module LRM, a camera module CMM, or the like. The components described above may be mounted directly on the motherboard, may be mounted on a separate board to be electrically connected to the display module 200 via a connector (not illustrated) or the like, or may be electrically connected to the first electronic module EM1.

The sound output module AOM converts sound data received from the wireless communication module TM or sound data stored in the memory MM and outputs the converted sound data to the outside.

The light emitting module LM generates and outputs light. The light emitting module LM may output infrared rays. The light emitting module LM may include an light emitting diode ("LED") element. The light receiving module LRM may detect infrared rays. The light receiving module LRM may be activated when infrared rays having a predetermined level or higher are detected. The light receiving module LRM may include a complementary metal oxide semiconductor ("CMOS") sensor. After infrared rays generated by the light emitting module LM are outputted, the infrared rays may be reflected by an external object (e.g., a user's finger or face), and the reflected infrared rays may be incident on the light receiving module LRM. The camera module CMM may capture an external image.

In an embodiment, each of the first and second electronic modules 501 and 502 shown in FIG. 1B may include at least one of the components of the first electronic module EM1 and the second electronic module EM2 shown in FIG. 2. In one embodiment, for example, each of the first and second electronic modules 501 and 502 may include at least one of the sound output module AOM, the light emitting module LM, the light receiving module LRM, the camera module CMM, or a thermal sensing module. The first and second electronic modules 501 and 502 may detect an external subject received through the second display area DA2 (illustrated in FIG. 1B), or may provide a sound signal such as a voice or light such as infrared rays to the outside through the second display area DA2.

Figure 3A:
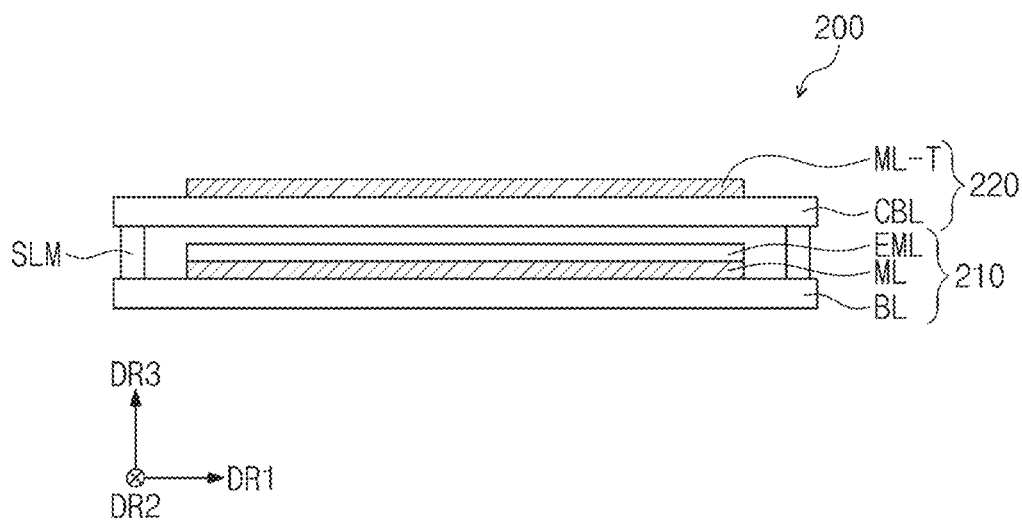
FIG. 3A is a cross-sectional view of a display module according to an embodiment of the invention.

FIG. 3A is a cross-sectional view of the display module according to an embodiment of the invention.

Referring to FIG. 3A, an embodiment of the display module 200 may include the display panel 210, the input sensing unit 220, and a bonding member SLM. The input sensing unit 220 may be referred to as an input sensing panel.

In an embodiment, the display panel 210 may be a light emitting display panel, and is not particularly limited. In one embodiment, for example, the display panel 210 may be an organic light emitting display panel or a quantum dot light emitting display panel.

The display panel 210 may include a base substrate BL, a display circuit layer ML, and a light emitting element layer EML. The input sensing unit 220 may include a cover substrate CBL and a sensing circuit layer ML-T.

Each of the base substrate BL and the cover substrate CBL may have a laminated structure including a silicon substrate, a plastic substrate, a glass substrate, an insulating film, or a plurality of insulating layers.

The display circuit layer ML may be disposed on the base substrate BL. The display circuit layer ML may include a plurality of insulating layers, a plurality of conductive layers, and a semiconductor layer. The plurality of conductive layers of the display circuit layer ML may constitute signal wires or a control circuit of a pixel.

The light emitting element layer EML may be disposed on the display circuit layer ML. The light emitting element layer EML may include a light emitting layer for generating light. In one embodiment, for example, a light emitting layer of an organic light emitting display panel may include an organic light emitting material. A light emitting layer of a quantum dot light emitting display panel may include at least one selected from a quantum dot and a quantum rod.

The cover substrate CBL may be disposed on the light emitting element layer EML. A predetermined space may be defined between the cover substrate CBL and the light emitting element layer EML. The space may be filled with air or an inert gas. In an embodiment of the invention, the space may also be filled with a filler such as a silicone-based polymer, an epoxy-based resin, and an acrylic resin.

The sensing circuit layer ML-T may be disposed on the cover substrate CBL. The sensing circuit layer ML-T may include a plurality of insulating layers and a plurality of conductive layers. The plurality of conductive layers may constitute a sensing electrode for sensing an external input, a sensing wire connected to the sensing electrode, and a sensing pad connected to the sensing wire.

The bonding member SLM may be disposed between the base substrate BL and the cover substrate CBL. The bonding member SLM may bond the base substrate BL and the cover substrate CBL. The bonding member SLM may include an organic material such as a photocurable resin and a photoplastic resin, or may include an inorganic material such as a frit seal, but not being limited thereto.

Figure 3B:
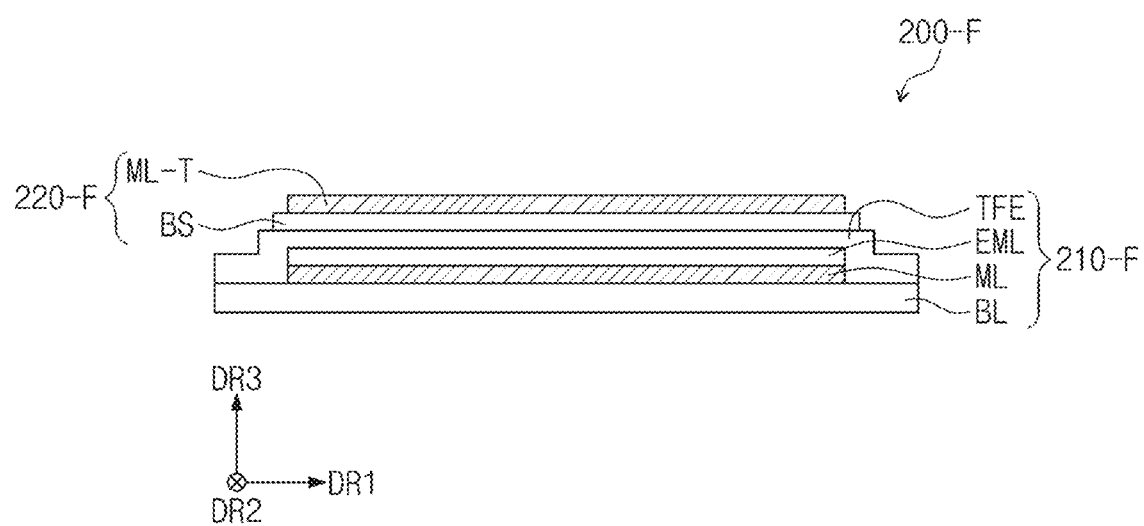
FIG. 3B is a cross-sectional view of a display module according to an alternative embodiment of the invention.

FIG. 3B is a cross-sectional view of a display module according to an alternative embodiment of the invention.

Referring to FIG. 3B, an embodiment of a display module 200-F may include a display panel 210-F and an input sensing unit 220-F. The input sensing unit 220-F may be referred to as an input sensing layer.

The display panel 210-F may include a base substrate BL, a display circuit layer ML, a light emitting element layer EML, and a thin film encapsulation layer TFE. The input sensing unit 220-F may include a base layer BS and a sensing circuit layer ML-T. The base layer BS may be disposed on the thin film encapsulation layer TFE. FIG. 3B illustrates a structure in which the base layer BS and the thin film encapsulation layer TFE are formed as separate layers. However, an embodiment of the invention is not limited thereto. In an alternative embodiment, the base layer BS and the thin film encapsulation layer TFE may be integrally formed as a single unitary unit.

According to an embodiment of the invention, the display panel 210-F and the input sensing unit 220-F may be formed in a continuous process. In such an embodiment, the base layer BS (or the sensing circuit layer ML-T) may be formed directly on the thin film encapsulation layer TFE.

Figure 4A:
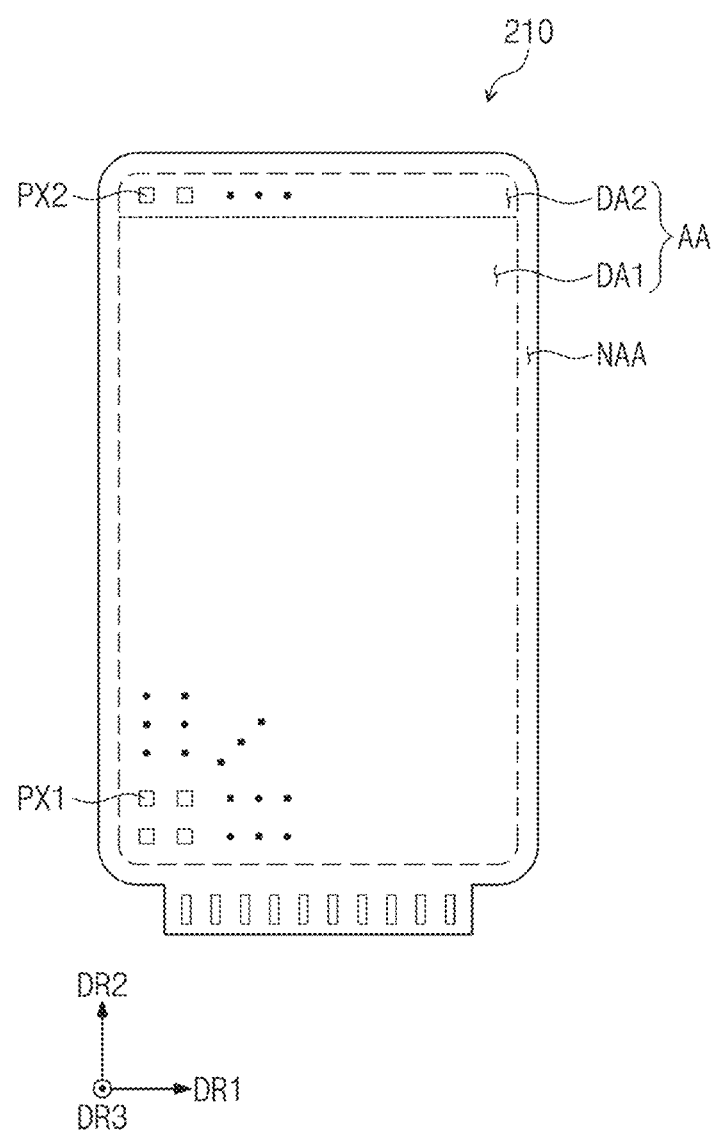
FIG. 4A is a plan view of a display panel according to an embodiment of the invention.

FIG. 4A is a plan view of the display panel according to an embodiment of the invention.

Referring to FIG. 4A, the first display area DA1 and the second display area DA2 may be defined in the display panel 210. The first display area DA1 and the second display area DA2 may correspond to the active area AA (see FIG. 1B) of the display module 200 (see FIG. 1B).

The electronic modules 500 (see FIG. 1B) may be disposed below the second display area DA2. Transmittance of the second display area DA2 may be higher than that of the first display area DA1. Accordingly, the electronic modules 500 may easily transmit and/or receive signals through the second display area DA2. In an embodiment, some elements of the second display area DA2 may be omitted to increase the transmittance. In one embodiment, for example, some of pixels arranged in the second display area DA2 may be omitted.

The first display area DA1 and the second display area DA2 may be adjacent to each other in the second direction DR2. The boundary between the first display area DA1 and the second display area DA2 may extend in the first direction DR1. When viewed in a plane, the second display area DA2 may be defined at an upper portion of the display panel 210.

First pixels PX1 may be arranged in the first display area DA1, and second pixels PX2 may be arranged in the second display area DA2. The first pixels PX1 and the second pixels PX2 may be pixels that generate light. The number of first pixels PX1 and the number of second pixels PX2 in a same unit area may be different from each other. In one embodiment, for example, the number of the second pixels PX2 in the same unit area may be less than the number of the first pixels PX1 in the same unit area. Accordingly, light transmittance of the second display area DA2 may be higher than light transmittance of the first display area DA1. In such an embodiment, resolution of the second display area DA2 may be lower than resolution of the first display area DA1.

The first and second pixels PX1 and PX2 may have a same configuration as each other. The configuration of the first and second pixels PX1 and PX2 will be described later greater detail.

Figure 4B:
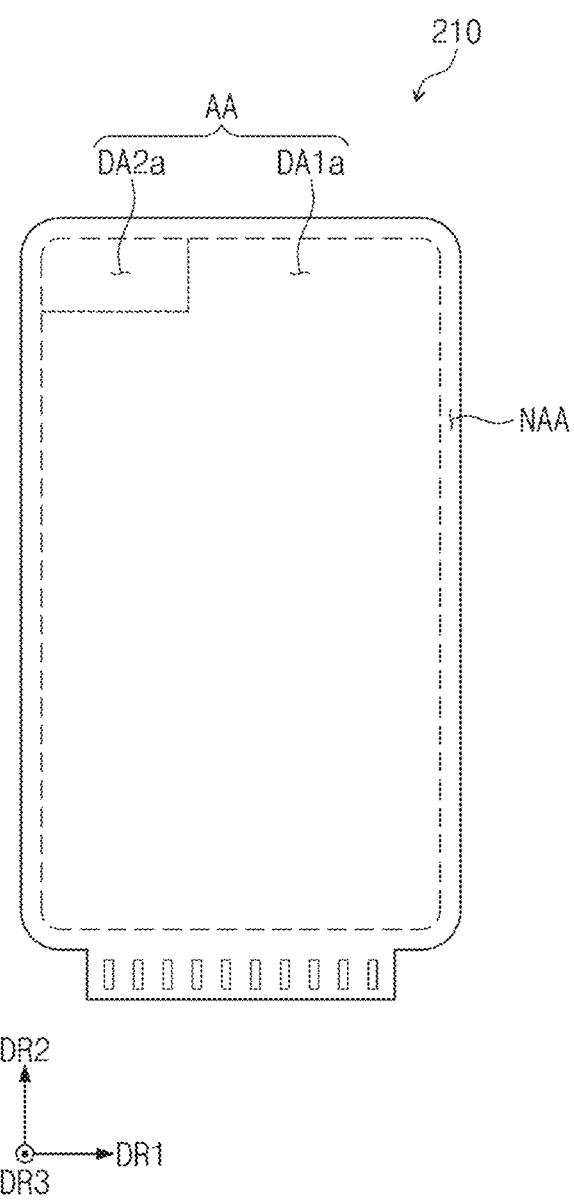
FIG. 4B is a plan view of a display panel according to an alternative embodiment of the invention.

FIG. 4B is a plan view of a display panel according to an alternative embodiment of the invention. In FIG. 4B, the same or like components as those described above with reference to FIG. 4A are denoted by the same or like reference numerals, and any repetitive detailed description thereof will be omitted.

Referring to FIG. 4B, in an embodiment, a first display area DA1a and a second display area DA2a may be defined in a display panel 210. The electronic modules 500 (see FIG. 1B) may be disposed below the second display area DA2a.

In one embodiment, for example, The second display area DA2a may be defined at an upper left corner as shown in FIG. 4B, but the position of the second display area DA2a may be variously modified based on the position of the electronic modules 500. In an alternative embodiment of the invention, for example, the second display area DA2a may be defined at an upper right corner of the display panel 210. In another alternative embodiment, the second display area DA2a may be defined at both the upper left and upper right corners of the display panel 210.

Figure 4C:
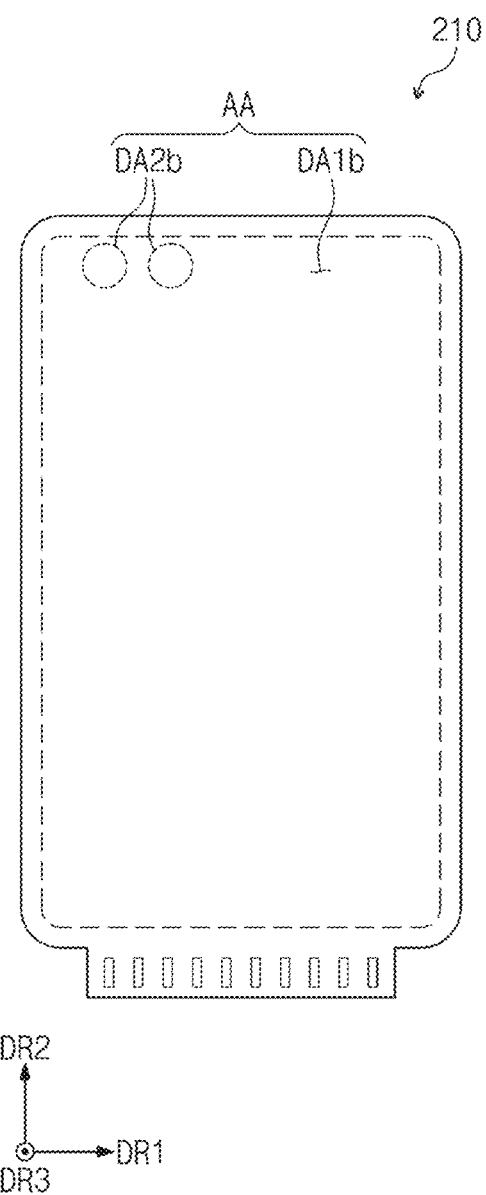
FIG. 4C is a plan view of a display panel according to another alternative embodiment of the invention.

FIG. 4C is a plan view of a display panel according to another alternative embodiment of the invention. In FIG. 4C, the same or like components as those described above with reference to FIG. 4A are denoted by the same or like reference numerals, and any repetitive detailed description thereof will be omitted.

Referring to FIG. 4C, in an embodiment, a first display area DA1b and a plurality of second display areas DA2b may be defined in a display panel 210.

The electronic modules 500 (see FIG. 1B) may be disposed below the plurality of second display areas DA2b. When viewed in a plane, each of the plurality of second display areas DA2b may have a surface area corresponding to the size of a corresponding one of the electronic modules. In one embodiment, for example, where the two electronic modules 501 and 502 (illustrated in FIG. 1B) are disposed, two second display areas DA2b may be provided in the active area AA. In such an embodiment, the two second display areas DA2b may be spaced apart from each other. In such an embodiment, each of the second display areas DA2b may be surrounded by the first display area DA1b.

In one embodiment, for example, the two second display areas DA2b may have a same value of light transmittance as each other. Herein, a value of a light transmittance (or a light transmittance value) of an area means a value of a light transmittance (or a light transmittance value) of light when passing through the area. However, an embodiment of the invention is not limited thereto. In an alternative embodiment, the two second display areas DA2b may have different values of light transmittance as each other.

Figure 5:
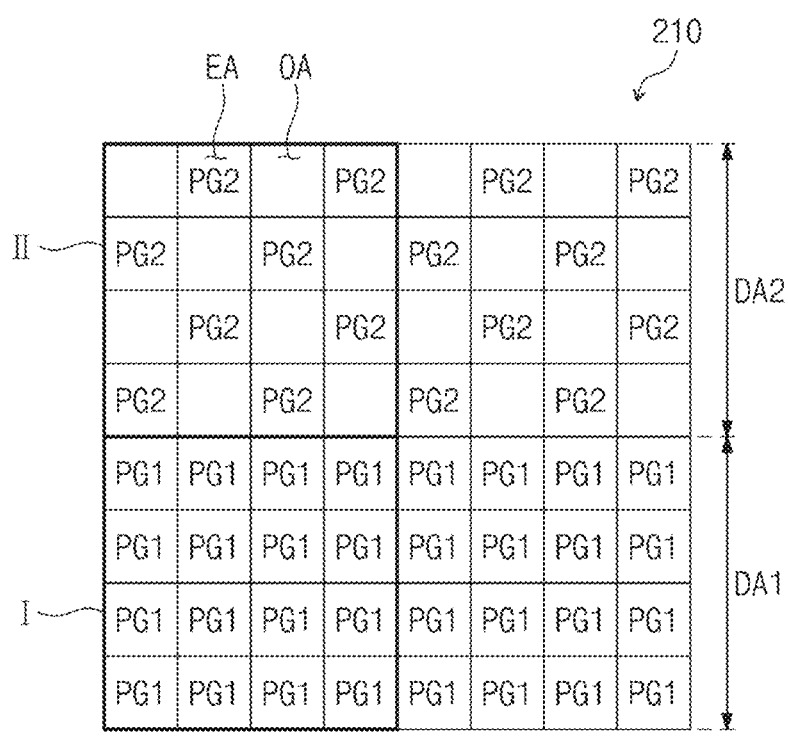
FIG. 5 is an enlarged plan view of a portion of a display panel according to an embodiment of the invention.
Figure 5:
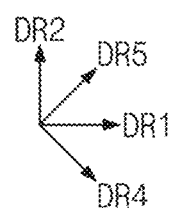

FIG. 5 is an enlarged plan view of a portion of a display panel according to an embodiment of the invention.

Referring to FIG. 4A and FIG. 5, an embodiment of the display panel 210 includes the first and second display areas DA1 and DA2. The first display area DA1 includes a plurality of first pixel groups PG1, and the second display area DA2 includes a plurality of second pixel groups PG2.

Each of the first pixel groups PG1 includes one or more first pixels PX1, and each of the second pixel groups PG2 includes one or more second pixels PX2. The structure and shape of the first pixels PX1 included in the first pixel groups PG1 may be the same as or different from the structure and shape of the second pixels PX2 included in the second pixel groups PG2. For convenience of description, embodiments where the pixels of the first and second pixel groups PG1 and PG2 have a same pixel structure as each other will be described later in greater detail with reference to FIGS. 6 to 12C, but not being limited thereto.

In the first display area DA1, the plurality of first pixel groups PG1 may be arranged in a matrix form including rows and columns, for example, in the first and second directions DR1 and DR2, respectively, which are different directions, or in two diagonal directions, respectively, crossing each other. Here, the two diagonal directions may be a fifth direction DR5 positioned between the first and second directions DR1 and DR2, and a fourth direction DR4 perpendicular to the fifth direction DR5.

The second display area DA2 includes a plurality of light emitting areas EA in which the plurality of second pixel groups PG2 are respectively disposed, and a plurality of open areas OA in which the second pixel groups PG2 are not disposed. The light emitting areas EA and the open areas OA may be alternately arranged with each other in the first and second directions DR1 and DR2. One of the open areas OA is disposed between two light emitting areas EA adjacent to each other in the first direction DR1 among the plurality of light emitting areas EA, and one of the open areas OA is disposed between two light emitting areas EA adjacent to each other in the second direction DR2 among the plurality of light emitting areas EA. In an embodiment of the invention, the number of the light emitting areas EA in the second display area DA2 and the number of the open areas OA in the second display area DA2 may be the same as each other. Accordingly, the number of second pixel groups PG2 may be half the number of first pixel groups PG1 in a same surface area of the first and second display areas DA1 and DA2. As a result, the light transmittance of the second display area DA2 may be higher than that of the first display area DA1. In such an embodiment, the resolution of the second display area DA2 may be lower than that of the first display area DA1.

In an embodiment, as shown in FIG. 5, the plurality of light emitting areas EA and the plurality of open areas OA are illustrated to be arranged in a matrix form in the fourth and fifth directions DR4 and DR5, but an embodiment of the invention is not limited thereto. In one alternative embodiment, for example, the plurality of light emitting areas EA and the plurality of open areas OA may be arranged in a matrix form in the first and second directions DR1 and DR2.

Figure 6:
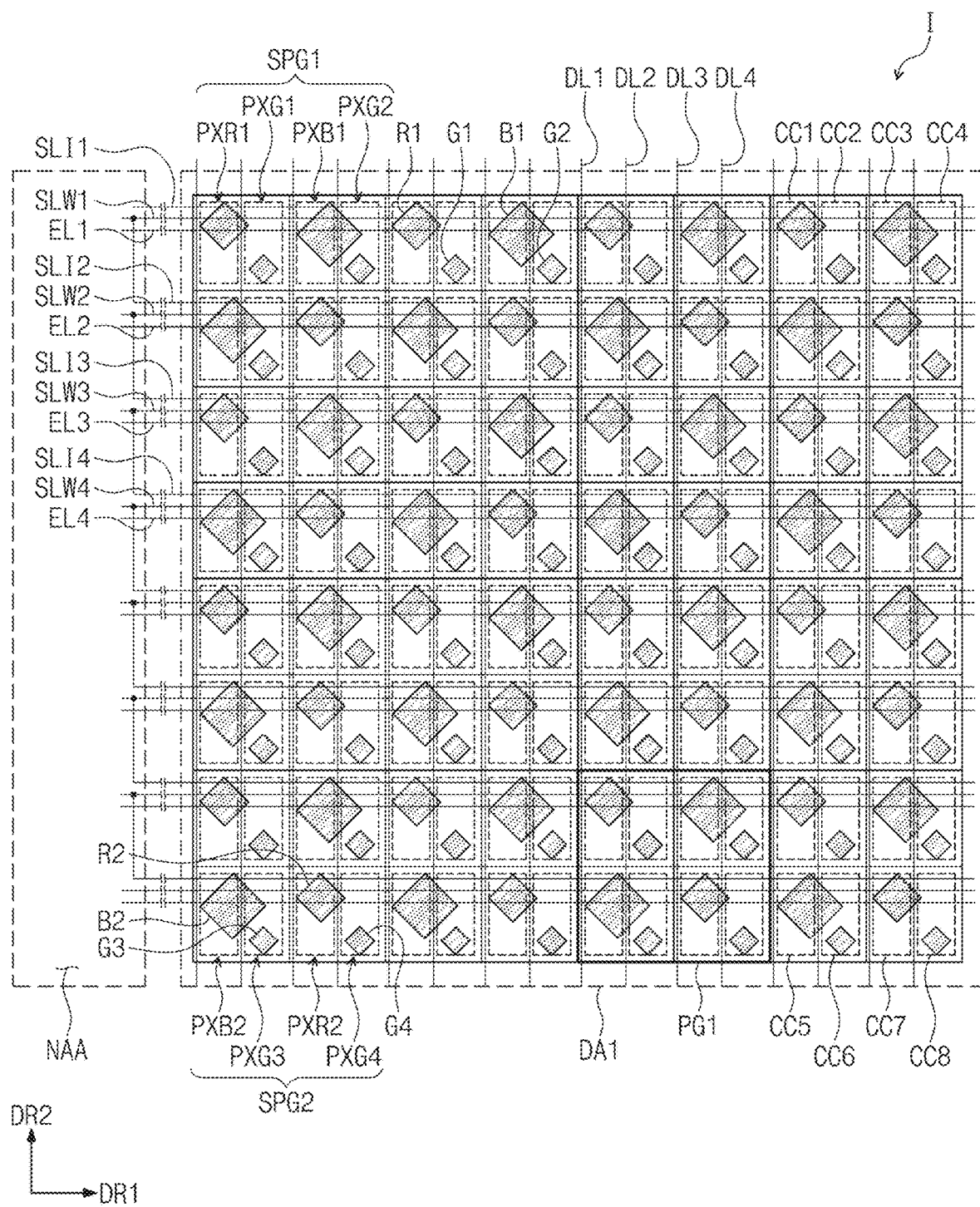
FIG. 6 is an enlarged plan view of an area I of FIG. 5.
Figure 7:
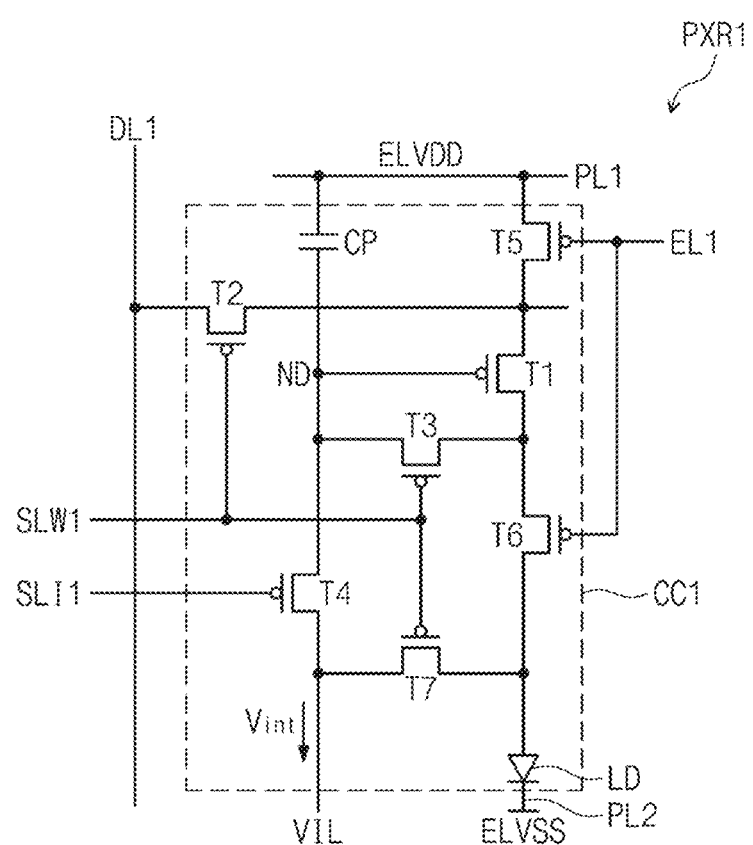
FIG. 7 is an equivalent circuit diagram of the first red pixel illustrated in FIG. 6.
Figure 8:
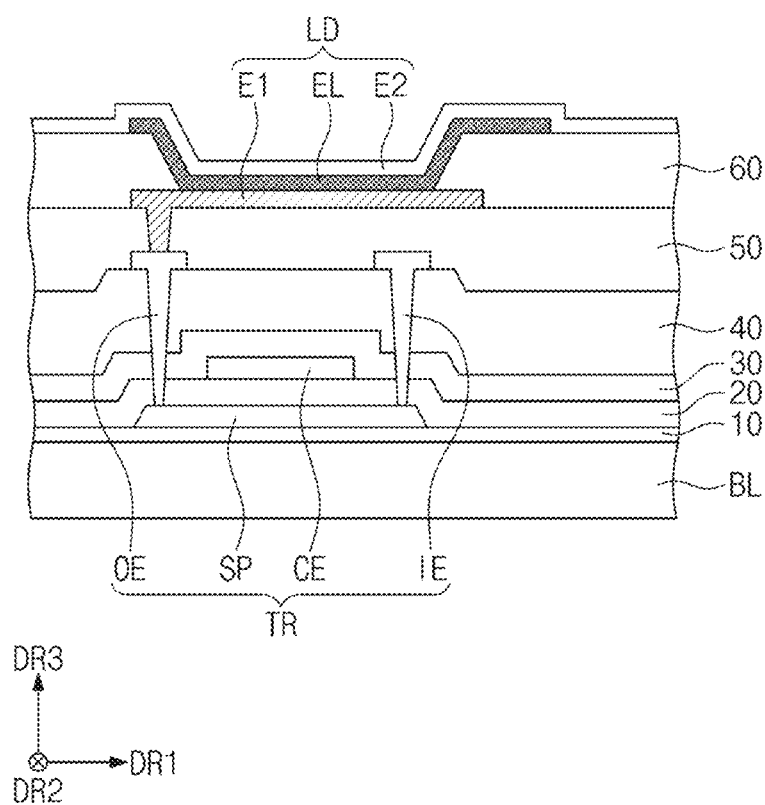
FIG. 8 is a cross-sectional view of some elements of the first display area illustrated in FIG. 6.

FIG. 6 is an enlarged plan view of an area I of FIG. 5, FIG. 7 is an equivalent circuit diagram of the first red pixel illustrated in FIG. 6, and FIG. 8 is a cross-sectional view of some elements of the first display area illustrated in FIG. 6.

Referring to FIGS. 5 and 6, the plurality of first pixel groups PG1 are arranged in the first and second directions DR1 and DR2 in the first display area DA1. Each of the plurality of first pixel groups PG1 includes a plurality of pixels. In one embodiment, for example, each of the first pixel groups PG1 may include eight pixels. In such an embodiment, four pixels of the eight pixels are included in a first sub pixel group SPG1, and remaining four pixels are included in a second sub pixel group SPG2. In an embodiment of the invention, the four pixels included in the first sub pixel group SPG1 may be a first red pixel PXR1, a first green pixel PXG1, a first blue pixel PXB1, and a second green pixel PXG2. The four pixels included in the second sub pixel group SPG2 may be a second blue pixel PXB2, a third green pixel PXG3, a second red pixel PXR2, and a fourth green pixel PXG4. The first sub pixel group SPG1 and the second sub pixel group SPG2 may be disposed adjacent to each other in the second direction DR2. The four pixels included in each of the sub pixel groups may be arranged adjacent to each other in the first direction DR1.

The first red pixel PXR1 includes a first pixel circuit part CC1 and a first red color pixel R1, and the first green pixel PXG1 includes a second pixel circuit part CC2 and a first green color pixel G1. The first blue pixel PXB1 includes a third pixel circuit part CC3 and a first blue color pixel B1, and the second green pixel PXG2 includes a fourth pixel circuit part CC4 and a second green color pixel G2. Configurations or shapes of the first to fourth pixel circuit parts CC1 to CC4 may be substantially the same as each other. The first red color pixel R1 and the first blue color pixel B1 may respectively overlap the first pixel circuit part CC1 and the third pixel circuit part CC3, and the first and second green color pixels G1 and G2 may respectively overlap the second and fourth pixel circuit parts CC2 and CC4. In an embodiment of the invention, the first blue color pixel B1 may have a larger size than the first red color pixel R1, and the first red color pixel R1 may have a larger size than the first and second green color pixels G1 and G2. The first and second green color pixels G1 and G2 may have the same size. The sizes of the color pixels are not limited thereto and may be variously modified and applied.

The second blue pixel PXB2 includes a fifth pixel circuit part CC5 and a second blue color pixel B2, and the third green pixel PXG3 includes a sixth pixel circuit part CC6 and a third green color pixel G3. The second red pixel PXR2 includes a seventh pixel circuit part CC7 and a second red color pixel R2, and the fourth green pixel PXG4 includes an eighth pixel circuit part CC8 and a fourth green color pixel G4. Configurations of the fifth to eighth pixel circuit parts CC5 to CC8 may be the same, and shapes thereof may be the same. The second blue color pixel B2 and the second red color pixel R2 may respectively overlap the fifth pixel circuit part CC5 and the seventh pixel circuit part CC7, and the third and fourth green color pixels G3 and G4 may respectively overlap the sixth and eighth pixel circuit parts CC6 and CC8. In an embodiment of the invention, the second blue color pixel B2 may have a larger size than the second red color pixel R2, and the second red color pixel R2 may have a larger size than the third and fourth green color pixels G3 and G4. The third and fourth green color pixels G3 and G4 may have the same size. The sizes of the color pixels are not limited thereto and may be variously modified and applied.

The display panel 210 includes a plurality of scan lines SLI1, SLW1, SLI2, SLW2, SLI3, SLW3, SLI4, SLW4 connected to the plurality of first pixel groups PG1. In such an embodiment, first to fourth scan lines SLI1, SLW1, SLI2 and SLW2 of the scan lines are connected to a plurality of first pixel groups PG1, among the plurality of first pixel groups PG1, arranged in a same row in the first display area DA1. The first to fourth scan lines SLI1, SLW1, SLI2, and SLW2 extend in the first direction DR1 and are sequentially arranged in the second direction DR2. The first and second scan lines SLI1 and SLW1 are connected to the first sub pixel group SPG1, and the third and fourth scan lines SLI2 and SLW2 are connected to the second sub pixel group SPG2. In an embodiment, the first to fourth pixel circuit parts CC1, CC2, CC3, and CC4 are connected to the first and second scan lines SLI1 and SLW1, and the fifth to eighth pixel circuit parts CC5, CC6, CC7, and CC8 are connected to the third and fourth scan lines SLI2 and SLW2.

The third scan line SLI2 may be connected to the second scan line SLW1 at the outer side of the first display area DA1 (that is, in the peripheral area NAA). Accordingly, the second scan line SLW1 is also electrically connected to the second sub pixel group SPG2 through the third scan line SLI2. In an embodiment, as illustrated in FIG. 6, the second scan line SLW1 may be connected to the fifth to eighth pixel circuit parts CC5, CC6, CC7, and CC8 through the third scan line SLI2. In such an embodiment, a same signal may be applied to the second and third scan lines SLW1 and SLI2.

The display panel 210 includes first to fourth data lines DL1, DL2, DL3, and DL4 connected to a plurality of first pixel groups PG1, among the plurality of first pixel groups PG1, arranged in a same column in the first display area DA1. The first to fourth data lines DL1, DL2, DL3, and DL4 extend in the second direction DR2 and are sequentially arranged in the first direction DR1. The first and fifth pixel circuit parts CC1 and CC5 are connected to the first data line DL1, and the second and sixth pixel circuit parts CC2 and CC6 are connected to the second data line DL2. The third and seventh pixel circuit parts CC3 and CC7 are connected to the third data line DL3, and the fourth and eighth pixel circuit parts CC4 and CC8 are connected to the fourth data line DL4.

The display panel 210 may further include a first light emission control line EL1, a second light emission control line and EL2, a third light emission control line EL3, and a fourth light emission control line EL4. The first to fourth light emission control lines EL1 to EL4 are connected to the first pixel group PG1. The first to fourth light emission control lines EL1 to EL4 may extend in the first direction DR1. The first and third light emission control lines EL1 and EL3 may be connected to the first sub pixel group SPG1, and the second and fourth light emission control lines EL2 and EL4 may be connected to the second sub pixel group SPG2.

The display panel 210 may further include a power supply voltage line, an initialization voltage line, or the like connected to the first pixel group PG1.

Hereinafter, the configuration of the first red pixel PXR1 will be described with reference to FIG. 7. In such an embodiment, the other pixels have the same configuration as that of the first red pixel PXR1, and for convenience of description, any repetitive detailed description of the configuration of the other pixels will be omitted.

Referring to FIG. 7, the first pixel circuit part CC1 of the first red pixel PXR1 may include a plurality of transistors T1 to T7, a capacitor CP, and a light emitting element LD. The plurality of transistors T1 to T7, and the capacitor CP of the first pixel circuit part CC1 may control the amount of current flowing into the light emitting element LD in response to a data signal and a scan signal.

Each of the plurality of transistors T1 to T7 may include an input electrode (or a source electrode), an output electrode (or a drain electrode), and a control electrode (or a gate electrode). Hereinafter, for convenience, one of the input electrode and the output electrode may be referred to as a first electrode, and the other of the input electrode and the output electrode may be referred to as a second electrode.

The first electrode of a first transistor T1 may be connected to a first power supply voltage line PL1 via a fifth transistor T5. The first power supply voltage line PL1 may be a wire through which a first power supply voltage ELVDD is provided. The second electrode of the first transistor T1 is connected to an anode of the light emitting element LD via a sixth transistor T6.

The first transistor T1 may control the amount of current flowing into the light emitting element LD in response to a voltage applied to the control electrode of the first transistor T1.

A second transistor T2 is connected between the first data line DL1 and the first electrode of the first transistor T1. The control electrode of the second transistor T2 is connected to the second scan line SLW1. When a second scan signal is provided to the second scan line SLW1, the second transistor T2 is turned on to electrically connect the first data line DL1 to the first electrode of the first transistor T1.

A third transistor T3 is connected between the second electrode of the first transistor T1 and the control electrode of the first transistor T1. The control electrode of the third transistor T3 is connected to the second scan line SLW1. When the second scan signal is provided to the second scan line SLW1, the third transistor T3 is turned on to electrically connect the second electrode of the first transistor T1 to the control electrode of the first transistor T1. Accordingly, the first transistor T1 is connected in the form of a diode when the third transistor T3 is turned on.

A fourth transistor T4 is connected between a node ND and an initialization voltage line VIL. The control electrode of the fourth transistor T4 is connected to the first scan line SLI1. The node ND may be a node to which the fourth transistor T4 and the control electrode of the first transistor T1 are connected to each other. When a first scan signal is provided to the first scan line SLI1, the fourth transistor T4 is turned on to provide an initialization voltage Vint to the node ND. The first scan signal may be generated before the second scan signal is generated.

The fifth transistor T5 is connected between the first power supply voltage line PL1 and the first electrode of the first transistor T1. The sixth transistor T6 is connected between the second electrode of the first transistor T1 and the anode of the light emitting element LD. The control electrode of the fifth transistor T5 and the control electrode of the sixth transistor T6 are connected to the first light emission control line EL1.

A seventh transistor T7 is connected between the initialization voltage line VIL and the anode of the light emitting element LD. The control electrode of the seventh transistor T7 is connected to the second scan line SLW1. When the second scan signal is provided to the second scan line SLW1, the seventh transistor T7 is turned on to provide the initialization voltage Vint to the anode of the light emitting element LD. In such an embodiment, as illustrated in FIG. 6, the second scan line SLW1 is connected to the third scan line SLI2. Accordingly, the second scan signal provided to the second scan line SLW1 may be transmitted to fourth transistors T4 of the fifth to eighth pixel circuit parts CC5, CC6, CC7, and CC8 through the third scan line SLI2. When a scan signal provided through the third scan line SLI2 is defined as a third scan signal, the second and third scan signals may be a same signal as each other.

The seventh transistor T7 may improve black display capability of the first red pixel PXR1. In such an embodiment, when the seventh transistor T7 is turned on, a parasitic capacitor (not illustrated) of the light emitting element LD is discharged. Then, when black luminance is implemented, light emission of the light emitting element LD, which may be caused by a leakage current from the first transistor T1, does not occur, and thus the black display capability may be improved.

In an embodiment, as shown in FIG. 7, the control electrode of the seventh transistor T7 may be connected to the second scan line SLW1, but an embodiment of the invention is not limited thereto. In an alternative embodiment of the invention, a control electrode of a seventh transistor T7 may be connected to an additional scan line for providing a scan signal different from the second scan signal.

In an embodiment, as shown in FIG. 7, the first to seventh transistors T1 to T7 may be P-type transistors, e.g., P-type metal-oxide-semiconductor ("PMOS") transistors, but not being limited thereto. In an alternative embodiment of the invention, some or all of first to seventh transistors T1 to T7 constituting a first pixel circuit part CC1 may be N-type transistors, e.g., N-type metal-oxide-semiconductor (NMOS) transistors.

The capacitor CP is disposed between the first power supply voltage line PL1 and the node ND. The capacitor CP stores a voltage corresponding to a data signal. When the fifth transistor T5 and the sixth transistor T6 are turned on, the amount of current flowing in the first transistor T1 may be determined based on the voltage stored in the capacitor CP.

The light emitting element LD may be electrically connected to the sixth transistor T6 and a second power supply voltage line PL2. The anode of the light emitting element LD is connected to the sixth transistor T6, and a cathode of the light emitting element LD is connected to the second power supply voltage line PL2. A second power supply voltage ELVSS may be applied to the second power supply voltage line PL2. The second power supply voltage ELVSS is lower than the first power supply voltage ELVDD. Accordingly, the light emitting element LD may emit light corresponding to a voltage difference between a signal transmitted through the sixth transistor T6 and the second power supply voltage ELVSS received through the second power supply voltage line PL2.

In an embodiment of the invention, the configuration of the first red pixel PXR1 is not limited to the configuration illustrated in FIG. 7. In an alternative embodiment of the invention, a first red pixel PXR1 may be variously modified to have an configuration for emitting light in a light emitting element LD.

Referring to FIGS. 7 and 8, in an embodiment, a first insulating layer 10 is disposed on the base substrate BL. The first insulating layer 10 may include a barrier layer and/or a buffer layer. The barrier layer may include an inorganic material. The barrier layer may effectively prevent oxygen or moisture introduced through the base substrate BL from permeating the pixel. The buffer layer may include an inorganic material. The buffer layer may provide lower surface energy than the base substrate BL so that the pixel is stably formed on the base substrate BL.

In FIG. 8, for convenience of illustration, only one transistor TR of the pixel circuit part CC1 is illustrated. The transistor TR may be the first transistor T1 illustrated in FIG. 7.

The transistor TR may be disposed on the first insulating layer 10. The transistor TR includes a semiconductor pattern SP, a control electrode CE, a first electrode IE, and a second electrode OE. The semiconductor pattern SP is disposed on the first insulating layer 10. The semiconductor pattern SP may include a semiconductor material. The control electrode CE is spaced apart from the semiconductor pattern SP with a second insulating layer 20 therebetween.

The first electrode IE and the second electrode OE are respectively connected to one side portion and another side portion of the semiconductor pattern SP through the second insulating layer 20, a third insulating layer 30, and a fourth insulating layer 40. In an embodiment, a laminated structure of the transistor TR may be variously modified, and is not limited to the embodiment illustrated in FIG. 8.

A fifth insulating layer 50 is disposed on the fourth insulating layer 40 to cover the first electrode IE and the second electrode OE. The fifth insulating layer 50 may include an organic material and/or an inorganic material, and may have a single layer structure or a multilayer structure, e.g., a laminated structure.

The light emitting element LD may include a pixel electrode E1, a light emitting layer EL, and a common electrode E2. The pixel electrode E1 is disposed on the fifth insulating layer 50. The pixel electrode E1 may be electrically connected to the transistor TR through the fifth insulating layer 50. Although the pixel electrode E1 is illustrated to be directly connected to the transistor TR in FIG. 8, the pixel electrode E1 may be electrically connected to the transistor TR via the sixth transistor T6 as illustrated in FIG. 7.

A sixth insulating layer 60 may be disposed on the fifth insulating layer 50. An opening may be defined in the sixth insulating layer 60, and the opening may expose at least a portion of the pixel electrode E1. The sixth insulating layer 60 may be a pixel defining film. The opening may correspond to a light emitting area of the first red pixel PXR1.

The light emitting layer EL may be disposed on the pixel electrode E1 exposed by the opening defined in the sixth insulating layer 60. The light emitting layer EL may include a light emitting material. In one embodiment, for example, the light emitting layer EL may include or be formed of at least one of materials that emit red, green, and blue light. The light emitting layer EL may include a fluorescent material or a phosphorescent material. The light emitting layer EL may include an organic light emitting material or an inorganic light emitting material. The light emitting layer EL may emit light in response to a potential difference between the pixel electrode E1 and the common electrode E2.

The common electrode E2 may be disposed on the light emitting layer EL. The common electrode E2 may have an integral shape extending from the active area AA (see FIG. 1B) to the peripheral area NAA (see FIG. 1B). The common electrode E2 may be provided in common to the plurality of pixels.

The common electrode E2 may include a transmissive conductive material or a transflective conductive material. Accordingly, light generated in the light emitting layer EL may be effectively emitted in the third direction DR3 through the common electrode E2. However, this is merely exemplary. In an embodiment, the light emitting element LD may be driven, according to a design thereof, in a bottom emission method in which the pixel electrode E1 includes a transmissive material or a transflective material, or in a double-sided emission method in which light is emitted toward both a front surface and a rear surface, and is not limited to any one embodiment.

Figure 9:
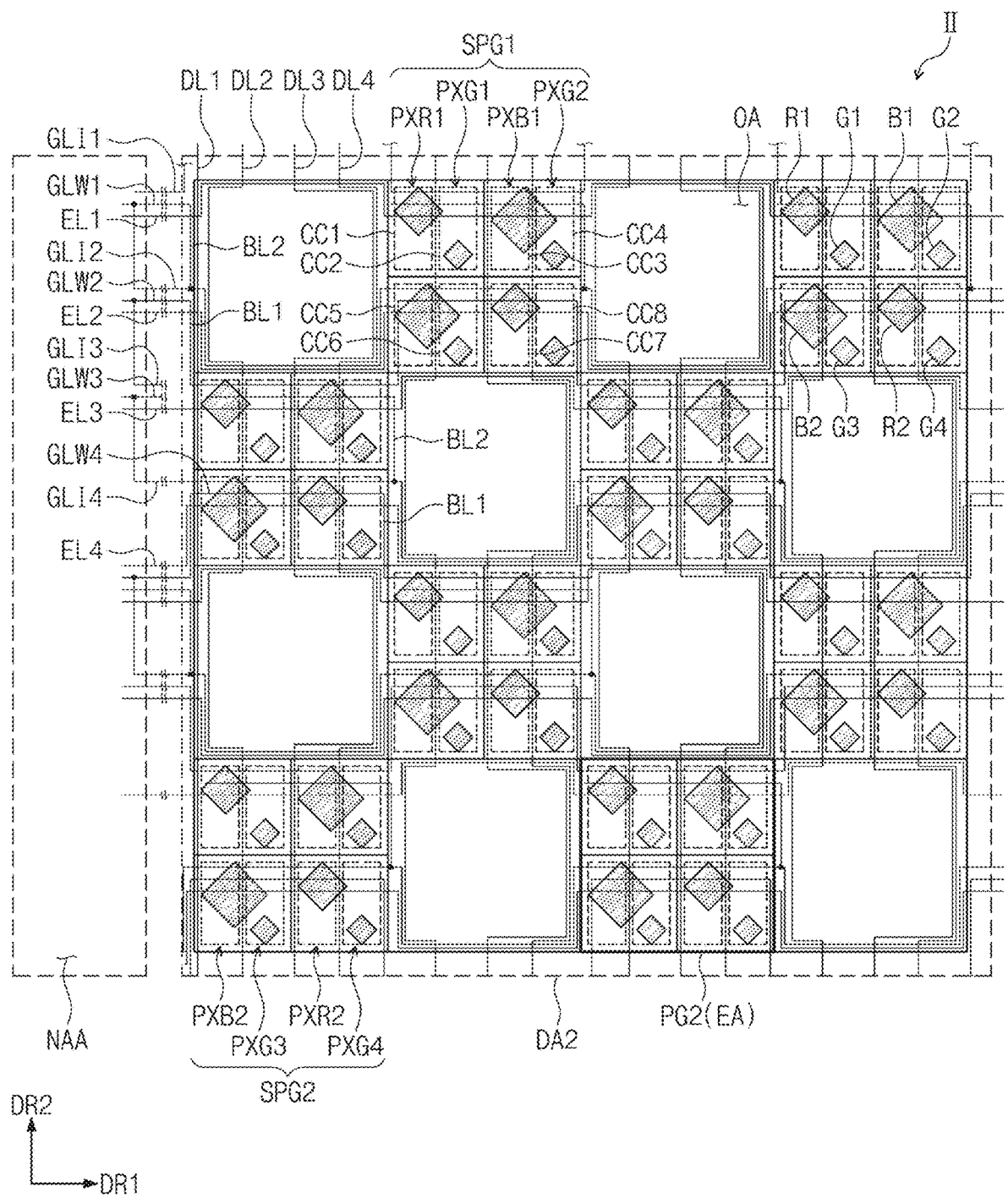
FIG. 9 is an enlarged plan view of an area II of FIG. 5.
Figure 10:
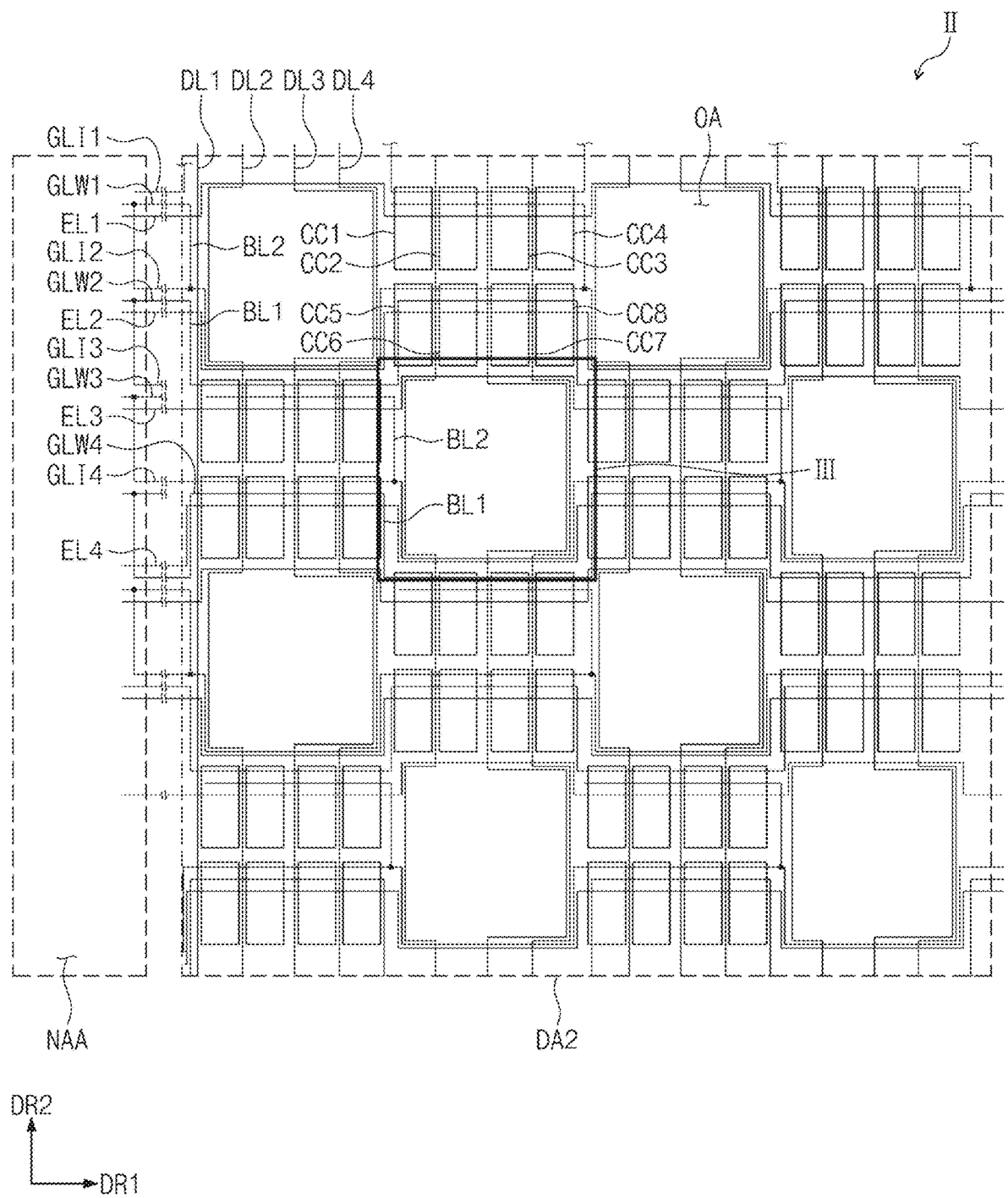
FIG. 10 is a plan view illustrating a connection relationship between the pixel circuit parts and the wires illustrated in FIG. 9.
Figure 11:
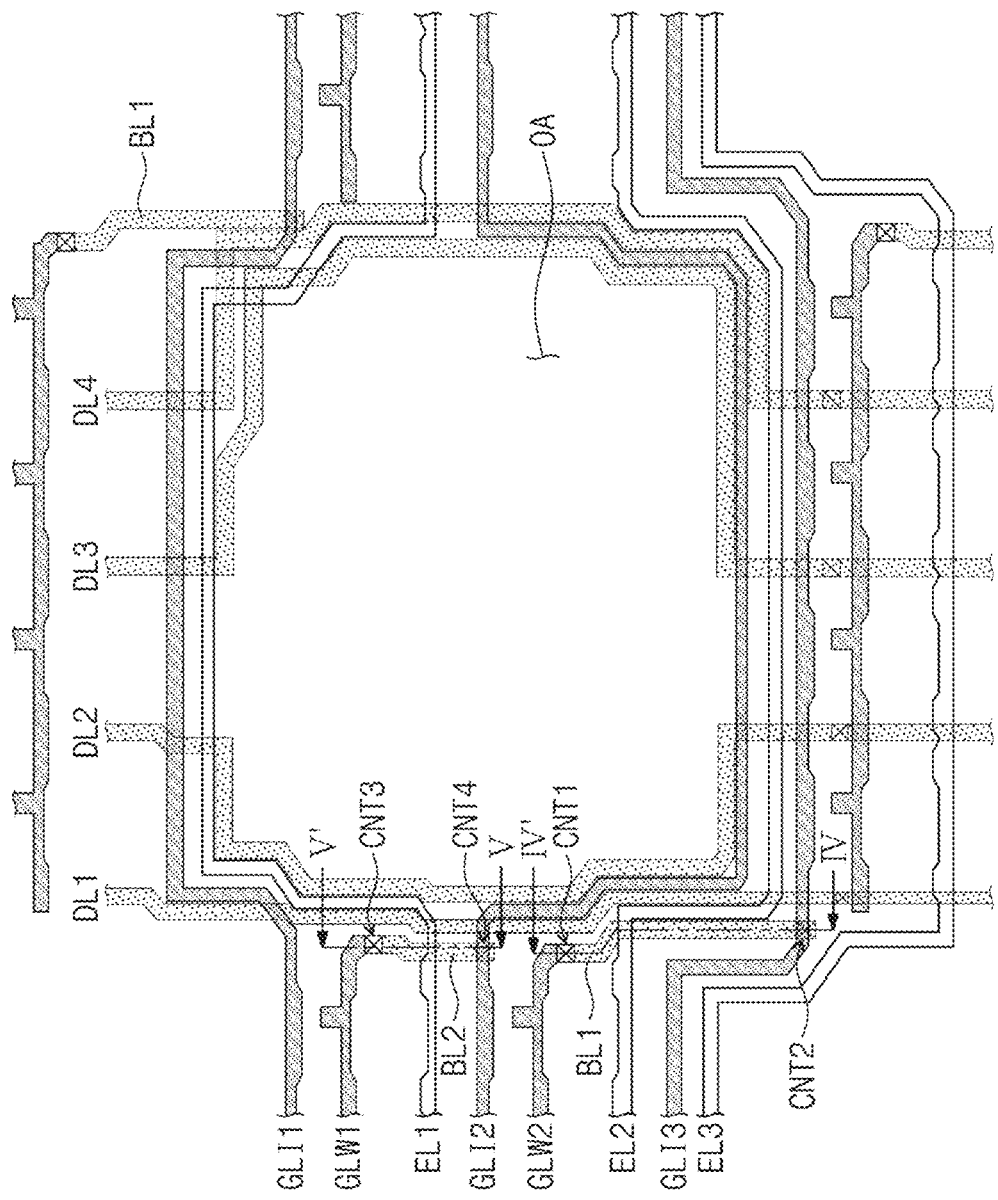
FIG. 11 is an enlarged plan view of an area III illustrated in FIG. 10.

FIG. 9 is an enlarged plan view of an area II of FIG. 5, FIG. 10 is a plan view illustrating a connection relationship between the pixel circuit parts and the wires illustrated in FIG. 9, and FIG. 11 is an enlarged plan view of an area III illustrated in FIG. 10.

Referring to FIGS. 5, 9, and 10, the second display area DA2 includes the plurality of light emitting areas EA in which the plurality of second pixel groups PG2 are respectively disposed, and the plurality of open areas OA in which the second pixel groups PG2 are not disposed. The light emitting areas EA and the open areas OA may be alternately arranged with each other in the first and second directions DR1 and DR2.

Each of the plurality of second pixel groups PG2 includes a plurality of pixels. Each of the plurality of second pixel groups PG2 has a same structure as each of the first pixel groups PG1. Accordingly, the same or like element of the second pixel groups PG2 have been labeled with the same or like reference characters as used above to describe the pixels constituting the first pixel groups PG1 with reference to FIG. 6.

In an embodiment of the invention, each of the second pixel groups PG2 may include eight pixels. Four pixels of the eight pixels are included in the first sub pixel group SPG1, and remaining four pixels are included in the second sub pixel group SPG2. In one embodiment, for example, the four pixels included in the first sub pixel group SPG1 may be the first red pixel PXR1, the first green pixel PXG1, the first blue pixel PXB1, and the second green pixel PXG2. In such an embodiment, the four pixels included in the second sub pixel group SPG2 may be the second blue pixel PXB2, the third green pixel PXG3, the second red pixel PXR2, and the fourth green pixel PXG4. The first sub pixel group SPG1 and the second sub pixel group SPG2 may be disposed adjacent to each other in the second direction DR2. The four pixels included in each of the sub pixel groups may be arranged adjacent to each other in the first direction DR1.

The first red pixel PXR1 includes the first pixel circuit part CC1 and the first red color pixel R1, and the first green pixel PXG1 includes the second pixel circuit part CC2 and the first green color pixel G1. The first blue pixel PXB1 includes the third pixel circuit part CC3 and the first blue color pixel B1, and the second green pixel PXG2 includes the fourth pixel circuit part CC4 and the second green color pixel G2. The configurations and shapes of the first to fourth pixel circuit parts CC1 to CC4 may be the same as each other. The first red color pixel R1 and the first blue color pixel B1 may respectively overlap the first pixel circuit part CC1 and the third pixel circuit part CC3, and the first and second green color pixels G1 and G2 may respectively overlap the second and fourth pixel circuit parts CC2 and CC4. In an embodiment of the invention, the first blue color pixel B1 may have a larger size than the first red color pixel R1, and the first red color pixel R1 may have a larger size than the first and second green color pixels G1 and G2. The first and second green color pixels G1 and G2 may have a same size as each other. The sizes of the color pixels are not limited thereto and may be variously modified and applied.

The second blue pixel PXB2 includes the fifth pixel circuit part CC5 and the second blue color pixel B2, and the third green pixel PXG3 includes the sixth pixel circuit part CC6 and the third green color pixel G3. The second red pixel PXR2 includes the seventh pixel circuit part CC7 and the second red color pixel R2, and the fourth green pixel PXG4 includes the eighth pixel circuit part CC8 and the fourth green color pixel G4. The configurations and the shapes of the fifth to eighth pixel circuit parts CC5 to CC8 may be the same as each other. The second blue color pixel B2 and the second red color pixel R2 may respectively overlap the fifth pixel circuit part CC5 and the seventh pixel circuit part CC7, and the third and fourth green color pixels G3 and G4 may respectively overlap the sixth and eighth pixel circuit parts CC6 and CC8. In an embodiment of the invention, the second blue color pixel B2 may have a larger size than the second red color pixel R2, and the second red color pixel R2 may have a larger size than the third and fourth green color pixels G3 and G4. The third and fourth green color pixels G3 and G4 may have a same size as each other. The sizes of the color pixels are not limited thereto and may be variously modified and applied.

The display panel 210 includes a plurality of scan lines GLI1, GLW1, GLI2, GLW2, GLW3, GLW4, GLI4 connected to the plurality of second pixel groups PG2. In an embodiment, the first to fourth scan lines GLI1, GLW1, GLI2, and GLW2 of the plurality of scan lines are connected to a plurality of second pixel groups PG2, among the plurality of second pixel groups PG2, arranged in the same row in the second display area DA2. The first and second scan lines Gill and GLW1 are connected to the first sub pixel group SPG1, and the third and fourth scan lines GLI2 and GLW2 are connected to the second sub pixel group SPG2. In an embodiment, the first to fourth pixel circuit parts CC1, CC2, CC3, and CC4 are connected to the first and second scan lines GLI1 and GLW1, and the fifth to eighth pixel circuit parts CC5, CC6, CC7, and CC8 are connected to the third and fourth scan lines GLI2 and GLW2.

The third scan line GLI2 may be connected to the second scan line GLW1 at the outer side of the second display area DA2 (that is, in the peripheral area NAA). Accordingly, the second scan line GLW1 is also electrically connected to the second sub pixel group SPG2 through the third scan line GLI2. In an embodiment, as illustrated in FIG. 10, the second scan line GLW1 may be connected to the fifth to eighth pixel circuit parts CC5, CC6, CC7, and CC8 through the third scan line GLI2. In such an embodiment, a same signal may be applied to the second and third scan lines GLW1 and GLI2.

In an embodiment, as illustrated in FIGS. 10 and 11, the first and second scan lines GLI1 and GLW1 extend in the first direction DR1 to overlap the first to fourth pixel circuit parts CC1 to CC4. A first scan line GLI1 connected to a second pixel group PG2 of an n-th row among the plurality of second pixel groups may be connected in the second display area DA2 to a fourth scan line connected to a second pixel group PG2 of an (n−1)-th row. A fourth scan line GLW2 connected to the second pixel group PG2 of the n-th row is connected in the second display area DA2 to a first scan line GLI3 connected to a second pixel group PG2 of an (n+1)-th row. The first scan line GLI1 of the n-th row may be connected in the second display area DA2 to the fourth scan line of the (n−1)-th row through a first bridge line BL1. In an embodiment, the fourth scan line GLW2 connected to the second pixel group PG2 of the n-th row may be connected in the second display area DA2 to the first scan line GLI3 connected to the second pixel group PG2 of the (n+1)-th row through the first bridge line BL1. In such an embodiment, the first bridge line BL1 may be disposed in the second display area DA2.

The third and fourth scan lines GLI2 and GLW2 extend in the first direction DR1 to overlap the fifth to eighth pixel circuit parts CC5 to CC8. One end of a second scan line GLW1 connected to the second pixel group PG2 of the n-th row among the plurality of second pixel groups PG2 is connected in the second display area DA2 to a third scan line GLI2 connected to the second pixel group PG2 of the n-th row. The one end of the second scan line GLW1 of the n-th row may be connected in the second display area DA2 to the third scan line GLI2 of the n-th row through a second bridge line BL2. In such an embodiment, the second bridge line BL2 may be disposed in the second display area DA2.

The third scan line GLI2 connected to the second pixel group PG2 of each row may extend in the first direction DR1 to overlap an open area OA, among the plurality of open areas OA, positioned in the same row. In such an embodiment, the third scan line GLI2 may be bent and extend along the lower edge of the open area OA. The second scan line GLW1 connected to the second pixel group PG2 of each row may have a structure cut in the open area. In such an embodiment, the second scan line GLW1 may not overlap the open area OA.

The display panel 210 may further include the first to fourth light emission control lines EL1 to EL4 connected to a plurality of second pixel groups PG2, among the plurality of second pixel groups PG2, arranged in the same row. The first to fourth light emission control lines EL1 to EL4 may extend in the first direction DR1. The first and third light emission control lines EL1 and EL3 may be connected to the first sub pixel group SPG1, and the second and fourth light emission control lines EL2 and EL4 may be connected to the second sub pixel group SPG2. The first and second light emission control lines EL1 and EL2 may extend in the first direction DR1 to overlap an open area OA, among the plurality of open areas OA, positioned in a same row. In such an embodiment, the first light emission control line EL1 may be bent and extend along the upper edge of the open area OA, and the second light emission control line EL2 may be bent and extend along the lower edge of the open area OA.

The display panel 210 includes the first to fourth data lines DL1, DL2, DL3, and DL4 connected to a plurality of second pixel groups PG2, among the plurality of second pixel groups PG2, arranged in the same column in the second display area DA2. The first to fourth data lines DL1, DL2, DL3, and DL4 extend in the second direction DR2 and are sequentially arranged in the first direction DR1. The first and fifth pixel circuit parts CC1 and CC5 are connected to the first data line DL1, and the second and sixth pixel circuit parts CC2 and CC6 are connected to the second data line DL2. The third and seventh pixel circuit parts CC3 and CC7 are connected to the third data line DL3, and the fourth and eighth pixel circuit parts CC4 and CC8 are connected to the fourth data line DL4.

The first to fourth data lines DL1 to DL4 may extend in the second direction DR2 to overlap an open area OA positioned in a same column. In one embodiment, for example, the first and second data lines DL1 and DL2 may be bent and extend along the left edge of the open area OA, and the third and fourth data lines DL3 and DL4 may be bent and extend along the right edge of the open area OA.

Figure 12A:
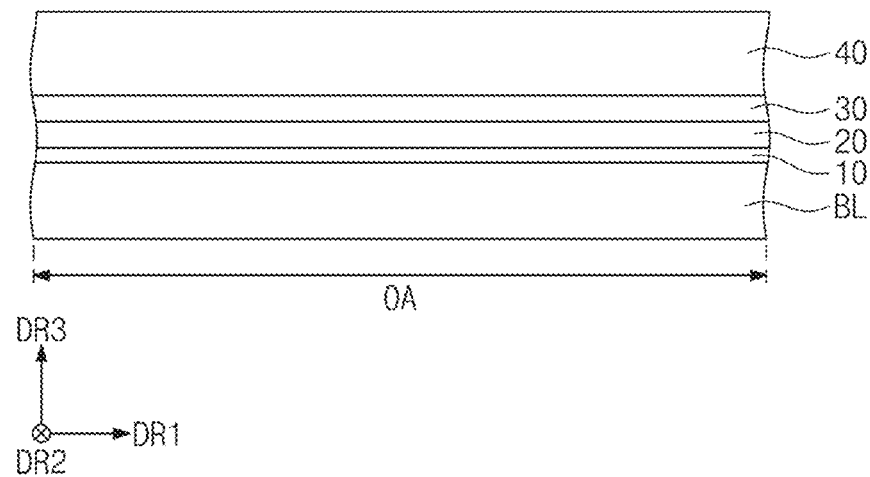
FIG. 12A is a cross-sectional view of the open area illustrated in FIG. 11.
Figure 12B:
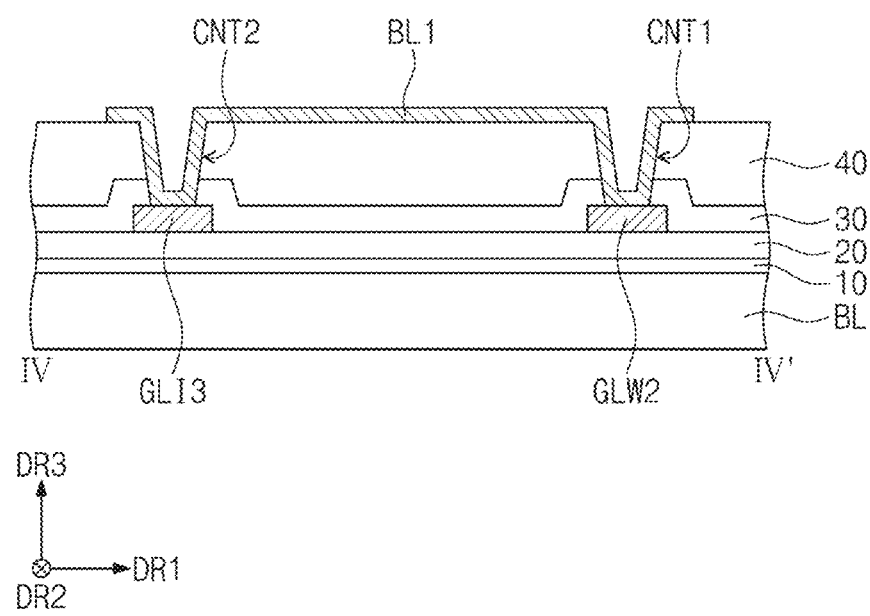
FIG. 12B is a cross-sectional view taken along line IV-IV' illustrated in FIG. 11.
Figure 12C:
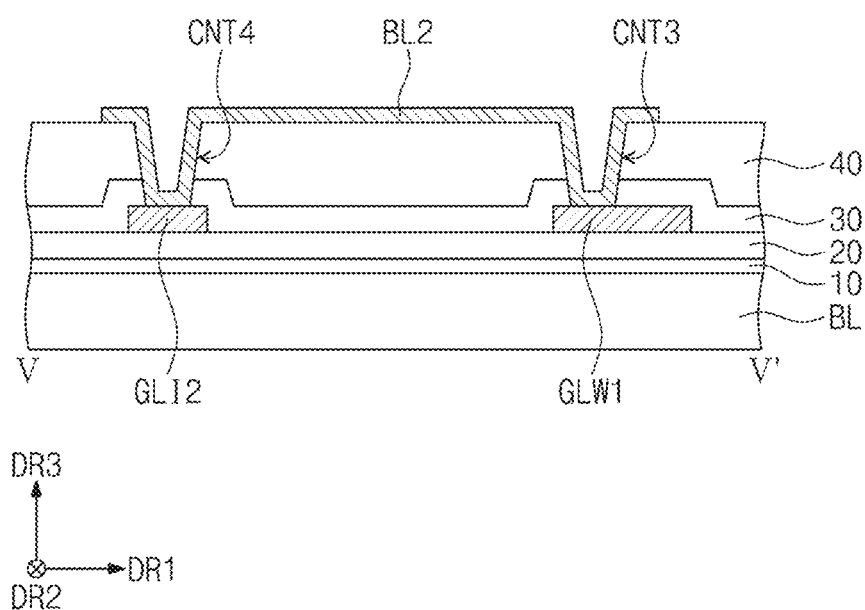
FIG. 12C is a cross-sectional view taken along line V-V' illustrated in FIG. 11.

FIG. 12A is a cross-sectional view of one of the open areas illustrated in FIG. 11, FIG. 12B is a cross-sectional view taken along line IV-IV' illustrated in FIG. 11, and FIG. 12C is a cross-sectional view taken along line V-V' illustrated in FIG. 11.

Referring to FIG. 12A, pixels may not be disposed in each of the open areas OA. Accordingly, the base substrate BL and the first to fourth insulating layers 10 to 40 may be disposed in the open area OA. However, this is merely exemplary, and an embodiment of the invention is not limited thereto.

In an alternative embodiment, some portions of the base substrate BL and the first to fourth insulating layers 10 to 40 in the open area OA may be removed to improve transmittance. In an alternative embodiment, the fifth and sixth insulating layers 50 and 60 and the common electrode E2 illustrated in FIG. 8 may be further disposed in the open area OA.

Referring to FIGS. 11 and 12B, the first bridge line BL1 electrically connects the fourth scan line GLW2 connected to the second pixel group PG2 of the n-th row to the first scan line GLI3 connected to the second pixel group PG2 of the (n+1)-th row.

The fourth scan line GLW2 of the n-th row and the first scan line GLI3 of the (n+1)-th row are disposed on the second insulating layer 20, and are covered by the third and fourth insulating layers 30 and 40. In such an embodiment, a first contact hole CNT1 for exposing one end of the fourth scan line GLW2 of the n-th row, and a second contact hole CNT2 for exposing a portion of the first scan line GLI3 of the (n+1)-th row may be defined or formed in the third and fourth insulating layers 30 and 40. The first bridge line BL1 is disposed on the fourth insulating layer 40, and connected to the fourth scan line GLW2 of the n-th row and the first scan line GLI3 of the (n+1)-th row through the first and second contact holes CNT1 and CNT2, respectively.

Accordingly, the fourth scan line GLW2 of the n-th row may have a structure cut in the open area OA. However, as illustrated in the drawing, the fourth scan line GLW2 of the n-th row is connected to the first scan line GLI3 of the (n+1)-th row through the first bridge line BL1, and thus the fourth scan line GLW2 of the n-th row may receive a scan signal through the first scan line GLI3 of the (n+1)-th row. Accordingly, the fifth to eighth pixel circuit parts CC5 to CC8 may receive a scan signal from the fourth scan line GLW2 of the n-th row and operate normally.

In such an embodiment where the fourth scan line GLW2 of the n-th row is removed from the open area OA, the area ratio of the open area OA may be improved, such that the light transmittance of the open area OA and the second display area DA2 may be improved.

Referring to FIGS. 11 and 12C, the second bridge line BL2 electrically connects the second scan line GLW1 of the n-th row and the third scan line GLI2 of the n-th row.

The second scan line GLW1 of the n-th row and the third scan line GLI2 of the n-th row are disposed on the second insulating layer 20, and are covered by the third and fourth insulating layers 30 and 40. In such an embodiment, a third contact hole CNT3 for exposing one end of the second scan line GLW1 of the n-th row, and a fourth contact hole CNT4 for exposing a portion of the third scan line GLI2 of the n-th row may be defined or formed in the third and fourth insulating layers 30 and 40. The second bridge line BL2 is disposed on the fourth insulating layer 40, and connected to the second scan line GLW1 of the n-th row and the third scan line GLI2 of the n-th row through the third and fourth contact holes CNT3 and CNT4, respectively.

Accordingly, the second scan line GLW1 of the n-th row may have a structure cut in the open area OA. However, as illustrated in the drawing, the second scan line GLW1 of the n-th row is connected to the third scan line GLI2 of the n-th row through the second bridge line BL2, and thus the second scan line GLW1 of the n-th row may receive a scan signal through the third scan line GLI2 of the n-th row. Accordingly, the first to fourth pixel circuit parts CC1 to CC4 may receive a scan signal from the second scan line GLW1 of the n-th row and operate normally.

In such an embodiment where the second scan line GLW1 of the n-th row is removed from the open area OA, the area ratio of the open area OA may be improved, such that the light transmittance of the open area OA and the second display area DA2 may be improved. In such an embodiment, the light transmittance of the second display area DA2 is improved, such that the sensing sensitivity of the electronic modules 500 (illustrated in FIG. 1B) disposed below the second display area DA2 may be improved.

Figure 13:
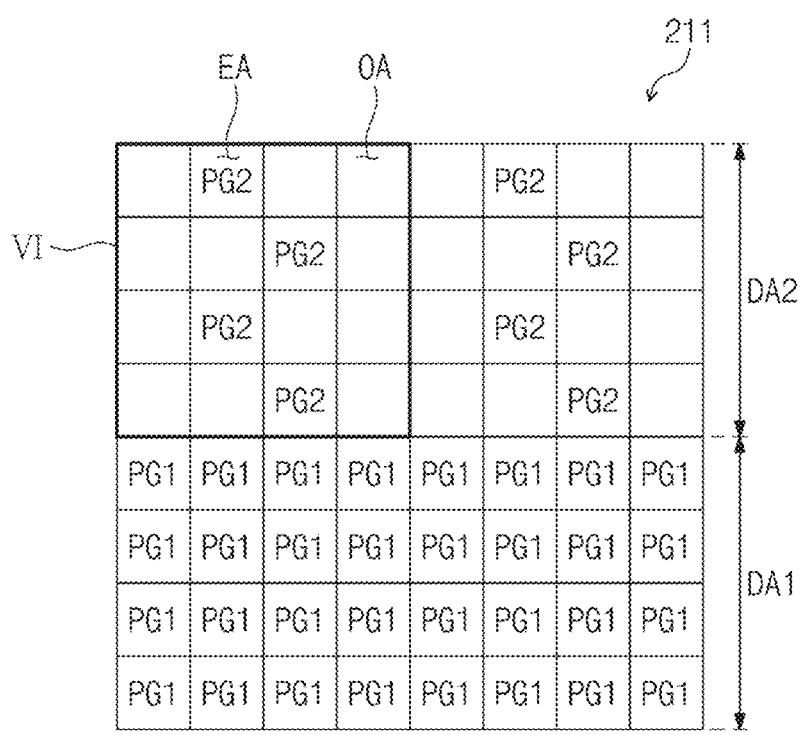
FIG. 13 is an enlarged plan view of a portion of a display panel according to an alternative embodiment of the invention.
Figure 13:
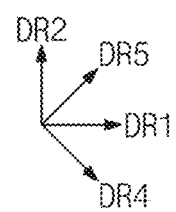

FIG. 13 is an enlarged plan view of a portion of a display panel according to an alternative embodiment of the invention.

Referring to FIG. 13, in an embodiment, a display panel 211 includes the first and second display areas DA1 and DA2. The first display area DA1 includes the plurality of first pixel groups PG1, and the second display area DA2 includes the plurality of second pixel groups PG2. Each of the first pixel groups PG1 includes one or more pixels, and each of the plurality of second pixel groups PG2 includes one or more pixels.

In the first display area DA1, the plurality of first pixel groups PG1 may be arranged in a matrix form having rows and columns, for example, in the first and second directions DR1 and DR2, respectively, which are different directions, or in two diagonal directions, respectively, crossing each other. Here, the two diagonal directions may be the fifth direction DR5 positioned between the first and second directions DR1 and DR2 and the fourth direction DR4 perpendicular to the fifth direction DR5.

The second display area DA2 includes the plurality of light emitting areas EA in which the plurality of second pixel groups PG2 are respectively disposed, and the plurality of open areas OA in which the second pixel groups PG2 are not disposed. In an embodiment of the invention, three open areas OA may be disposed between two light emitting areas EA adjacent to each other in the first direction DR1 among the plurality of light emitting areas EA. The plurality of light emitting areas EA may be alternately disposed with the plurality of open areas OA in the second direction DR2. One of the open areas OA is disposed between two light emitting areas EA adjacent to each other in the second direction DR2 among the plurality of light emitting areas EA.

In such an embodiment, the number of the plurality of light emitting areas EA may be less than the number of the plurality of open areas OA in the second display area DA2. In one embodiment, for example, the number of the plurality of light emitting areas EA may be one third of the number of the plurality of open areas OA. Accordingly, in a same surface area of the first and second display areas DA1 and DA2, the number of second pixel groups PG2 may be one quarter of the number of first pixel groups PG1. As a result, the light transmittance of the second display area DA2 may be higher than that of the first display area DA1. In such an embodiment, the resolution of the second display area DA2 may be lower than that of the first display area DA1.

When compared with the display panel 210 illustrated in FIG. 5, the display panel 211 illustrated in FIG. 13 has higher light transmittance.

Figure 14:
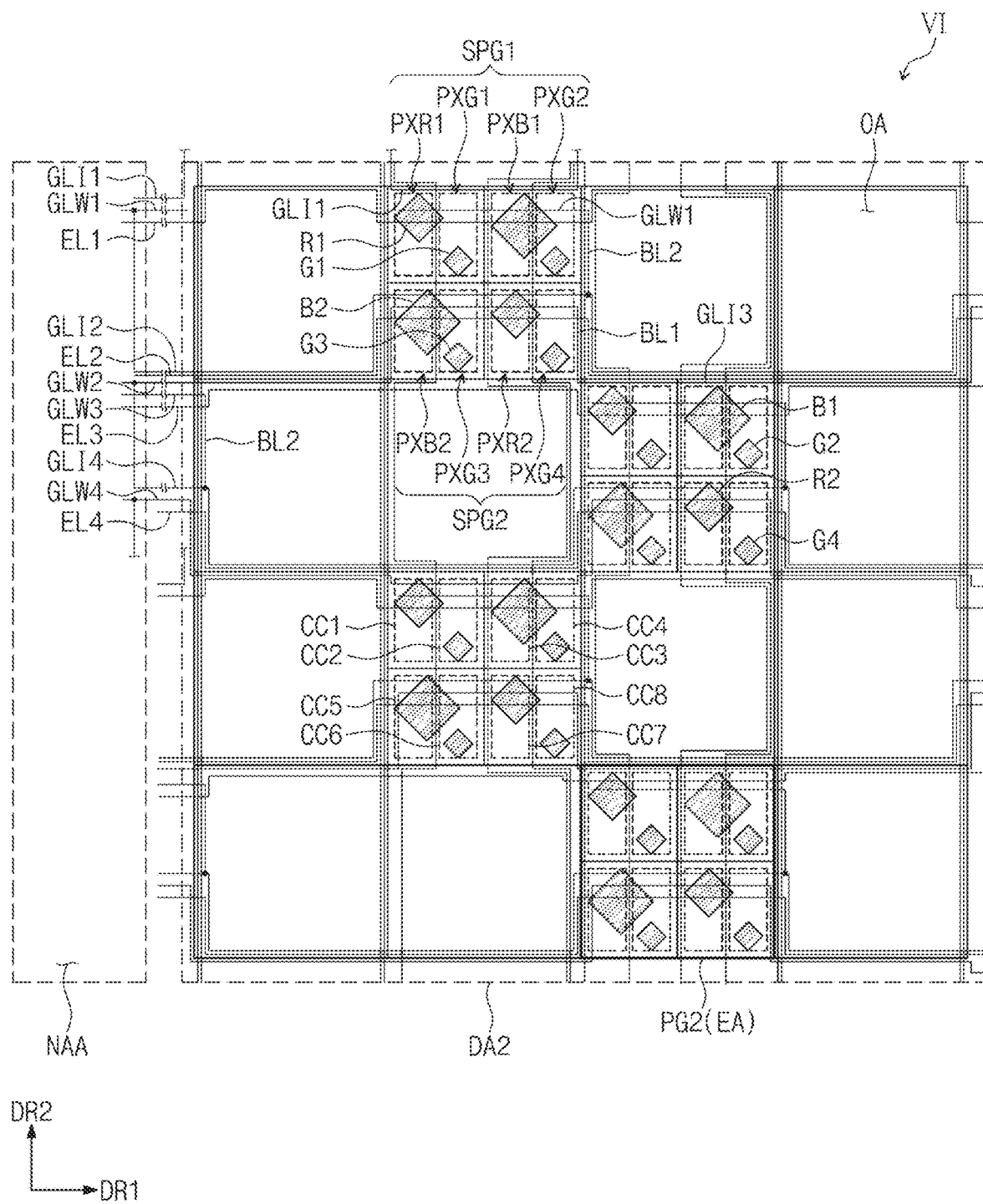
FIG. 14 is an enlarged plan view of an area VI of FIG. 13.
Figure 15:
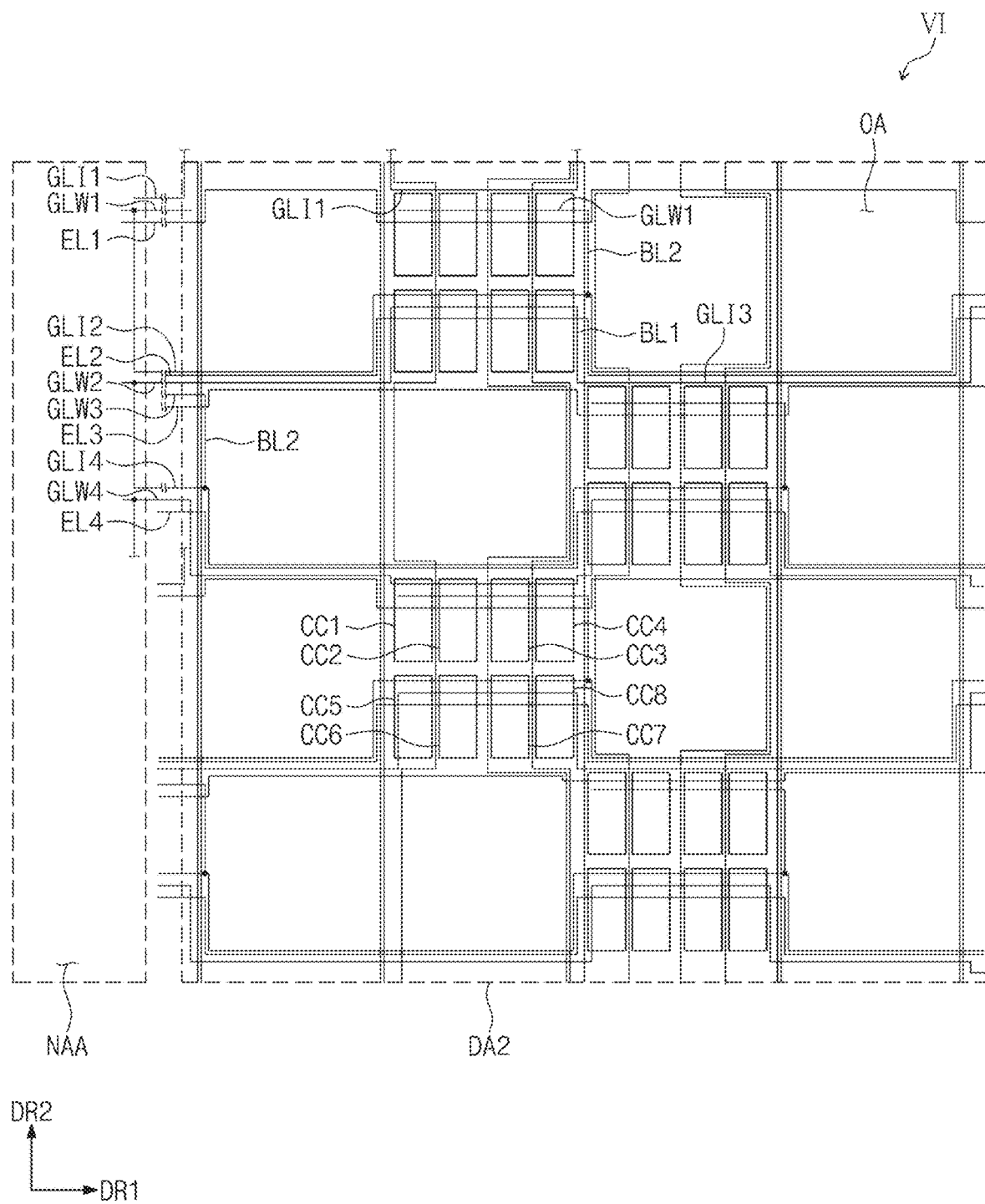
FIG. 15 is a plan view illustrating a connection relationship between the pixel circuit parts and the wires illustrated in FIG. 14.

FIG. 14 is an enlarged plan view of an area VI of FIG. 13, and FIG. 15 is a plan view illustrating a connection relationship between the pixel circuit parts and the wires illustrated in FIG. 14. The same or like elements shown in FIGS. 14 and 15 have been labeled with the same reference characters as used above to describe the embodiment shown in FIGS. 9 and 10, and any repetitive detailed description thereof will hereinafter be omitted or simplified.

Referring to FIG. 14, the second display area DA2 includes the plurality of light emitting areas EA in which the plurality of second pixel groups PG2 are respectively disposed, and the plurality of open areas OA in which the second pixel groups PG2 are not disposed. In FIG. 14, four light emitting areas of the light emitting areas EA and 12 open areas of the open areas OA are illustrated. In such an embodiment, the number of the light emitting areas EA may be one third of the number of the open areas OA. In an embodiment, as shown in FIG. 9, the number of the light emitting areas EA may be the same as the number of the open areas OA in the second display area DA2. In an alternative embodiment, as shown in FIG. 14, the number of the open areas OA may be greater than the number of the light emitting areas EA in the second display area DA2. In such an embodiment, as shown in FIG. 14, the number of the open areas OA increases to be three times the number of the light emitting areas EA, and the connection structure of the first to fourth scan lines GLI1, GLW1, GLI2, and GLW2 is similar to that of the embodiment illustrated in FIGS. 9 and 10.

In an embodiment, as illustrated in FIGS. 13 to 15, the display panel 211 includes the first to fourth scan lines GLI1, GLW1, GLI2, and GLW2 connected to a plurality of second pixel groups PG2, among the plurality of second pixel groups PG2, arranged in the same row in the second display area DA2. The first and second scan lines GLI1 and GLW1 are connected to the first sub pixel group SPG1, and the third and fourth scan lines GLI2 and GLW2 are connected to the second sub pixel group SPG2. In such an embodiment, the first to fourth pixel circuit parts CC1, CC2, CC3, and CC4 are connected to the first and second scan lines GLI1 and GLW1, and the fifth to eighth pixel circuit parts CC5, CC6, CC7, and CC8 are connected to the third and fourth scan lines GLI2 and GLW2.

The third scan line GLI2 may be connected to the second scan line GLW1 at the outer side of the second display area DA2 (that is, in the peripheral area NAA). Accordingly, the second scan line GLW1 is also electrically connected to the second sub pixel group SPG2 through the third scan line GLI2. In an embodiment, as illustrated in FIG. 15, the second scan line GLW1 may be connected to the fifth to eighth pixel circuit parts CC5, CC6, CC7, and CC8 through the third scan line GLI2. In such an embodiment, a same signal may be applied to the second and third scan lines GLW1 and GLI2.

In an embodiment, as illustrated in FIGS. 14 and 15, the first and second scan lines GLI1 and GLW1 extend in the first direction DR1 to overlap the first to fourth pixel circuit parts CC1 to CC4. A first scan line GLI1 connected to a second pixel group PG2 of an n-th row among the plurality of second pixel groups may be connected in the second display area DA2 to a fourth scan line connected to a second pixel group PG2 of an (n−1)-th row. A fourth scan line GLW2 connected to the second pixel group PG2 of the n-th row is connected in the second display area DA2 to a first scan line GLI3 connected to a second pixel group PG2 of an (n+1)-th row. The first scan line GLI1 of the n-th row may be connected in the second display area DA2 to the fourth scan line of the (n−1)-th row through the first bridge line BL1. In such an embodiment, the fourth scan line GLW2 connected to the second pixel group PG2 of the n-th row may be connected in the second display area DA2 to the first scan line GLI3 connected to the second pixel group PG2 of the (n+1)-th row through the first bridge line BL1. In such an embodiment, the first bridge line BL1 may be disposed in the second display area DA2.

The third and fourth scan lines GLI2 and GLW2 extend in the first direction DR1 to overlap the fifth to eighth pixel circuit parts CC5 to CC8. One end of a second scan line GLW1 connected to the second pixel group PG2 of the n-th row among the plurality of second pixel groups PG2 is connected in the second display area DA2 to a third scan line GLI2 connected to the second pixel group PG2 of the n-th row. The one end of the second scan line GLW1 of the n-th row may be connected in the second display area DA2 to the third scan line GLI2 of the n-th row through the second bridge line BL2. In such an embodiment, the second bridge line BL2 may be disposed in the second display area DA2.

The third scan line GLI2 connected to a second pixel group PG2 of each row may extend in the first direction DR1 to overlap first and second open areas OA1 and OA2 positioned adjacent to the second pixel group PG2 in the same row. In an embodiment, the third scan line GLI2 may be bent and extend along the lower edges of the first and second open areas OA1 and OA2. The second scan line GLW1 connected to the second pixel group PG2 of each row may have a structure cut in the first and second open areas OA1 and OA2. In such an embodiment, the second scan line GLW1 may not overlap the first and second open areas OA1 and OA2.

The display panel 211 may further include the first to fourth light emission control lines EL1 to EL4 connected to a plurality of second pixel groups PG2 arranged in a same row among the plurality of second pixel groups PG2. The first to fourth light emission control lines EL1 to EL4 may extend in the first direction DR1. The first and third light emission control lines EL1 and EL3 may be connected to the first sub pixel group SPG1, and the second and fourth light emission control lines EL2 and EL4 may be connected to the second sub pixel group SPG2. The first and second light emission control lines EL1 and EL2 may extend in the first direction DR1 to overlap open areas OA positioned in a same row among the plurality of open areas OA. In such an embodiment, the first light emission control line EL1 may be bent and extend along the upper edges of the first and second open areas OA1 and OA2, and the second light emission control line EL2 may be bent and extend along the lower edges of the first and second open areas OA1 and OA2.

The display panel 211 includes the first to fourth data lines DL1, DL2, DL3, and DL4 connected to a plurality of second pixel groups PG2, among the plurality of second pixel groups PG2, arranged in the same column in the second display area DA2. The first to fourth data lines DL1, DL2, DL3, and DL4 extend in the second direction DR2 and are sequentially arranged in the first direction DR1. The first and fifth pixel circuit parts CC1 and CC5 are connected to the first data line DL1, and the second and sixth pixel circuit parts CC2 and CC6 are connected to the second data line DL2. The third and seventh pixel circuit parts CC3 and CC7 are connected to the third data line DL3, and the fourth and eighth pixel circuit parts CC4 and CC8 are connected to the fourth data line DL4.

The first and fourth data lines DL1 and DL4 may extend in the second direction DR2 to overlap open areas OA, among the plurality of open areas OA, positioned in the same column. In one embodiment, for example, the first and second data lines DL1 and DL2 may be bent and extend along the left edges of the open areas OA, and the third and fourth data lines DL3 and DL4 may be bent and extend along the right edges of the open areas OA.

In an embodiment, as illustrated in FIGS. 14 and 15, the second scan line GLW1 of the n-th row and the fourth scan line GLW2 of the n-th row may have a structure cut in an open area OA of the plurality of open areas OA. In such an embodiment, the second scan line GLW1 of the n-th row and the fourth scan line GLW2 of the n-th row are removed from the open area OA, the area ratio of the open area OA may be improved, such that the light transmittance of the open area OA and the second display area DA2 may be improved. In such an embodiment, the light transmittance of the second display area DA2 is improved, such that the sensing sensitivity of the electronic modules 500 (illustrated in FIG. 1B) disposed below the second display area DA2 may be improved.

Figure 16:
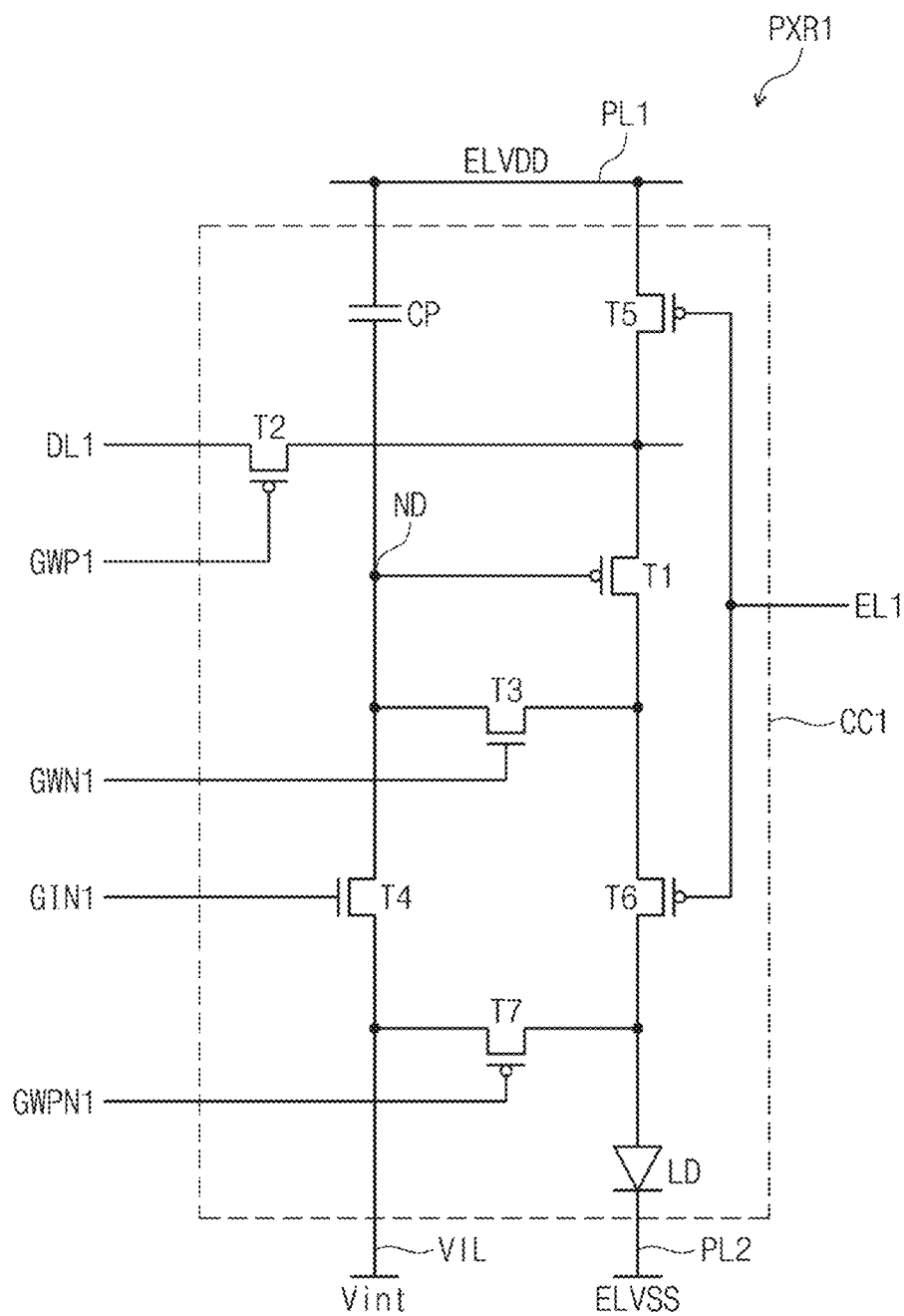
FIG. 16 is an equivalent circuit diagram of a pixel according to an embodiment of the invention.

FIG. 16 is an equivalent circuit diagram of a first red pixel according to an embodiment of the invention.

Referring to FIG. 16, in an embodiment, a first pixel circuit part CC1 of the first red pixel may include a plurality of transistors T1 to T7, a capacitor CP, and a light emitting element LD. Each of first, second, fifth, sixth, and seventh transistors T1, T2, T5, T6, and T7 of the plurality of transistors T1 to T7 may be a P-type transistor having a low temperature polycrystalline silicon ("LTPS") semiconductor layer, and each of third and fourth transistors T3 and T4 may be an N-type transistor having an oxide semiconductor as a semiconductor layer. However, an embodiment of the invention is not limited thereto, and alternatively, at least one of the first to seventh transistors T1 to T7 may be an N-type transistor, and the rest thereof may be P-type transistors.

A first data line DL1, a first P-type scan line GWP1, a first N-type scan line GWN1, a second N-type scan line GIN', and a second P-type scan line GWPN1 may be connected to the first pixel circuit part CC1.

For convenience of description, the first P-type scan line GWP1, the first N-type scan line GWN1, the second N-type scan line GIN', and the second P-type scan line GWPN1 are respectively referred to as a first scan line GWP1, a second scan line GWN1, a third scan line GIN', and a fourth scan line GWPN1.

The first and fourth scan lines GWP1 and GWPN1 of the first to fourth scan lines GWP1, GWN1, GIN', and GWPN1 may be respectively connected to the second and seventh transistors T2 and T7 that are P-type transistors. The second and third scan lines GWN1 and GIN1 of the first to fourth scan lines GWP1, GWN1, GIN1, and GWPN1 may be respectively connected to the third and fourth transistors T3 and T4 that are N-type transistors.

Figure 17:
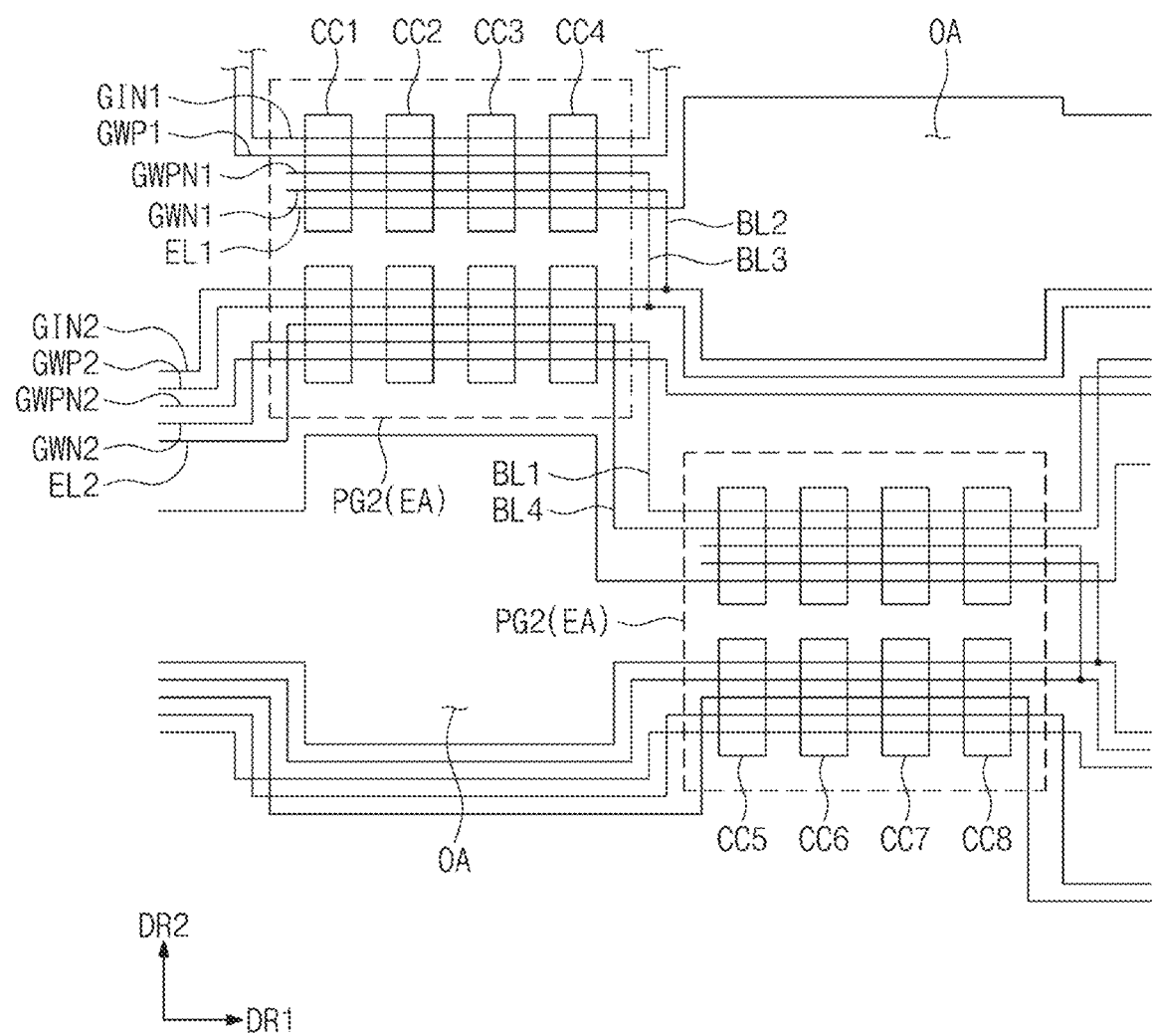
FIG. 17 is a plan view illustrating a connection relationship between pixel circuit parts and wires according to an embodiment of the invention.

FIG. 17 is a plan view illustrating a connection relationship between pixel circuit parts and wires according to an embodiment of the invention.

Referring to FIGS. 16 and 17, in an embodiment, first to eighth scan lines GWP1, GWN1, GIN1, GWPN1, GWP2, GWN2, GIN2, GWPN2 may be connected to a plurality of second pixel groups PG2 arranged in a same row in the second display area DA2. The first to fourth scan lines GWP1, GWN1, GIN1, and GWPN1 are connected to a first sub pixel group, and the fifth to eighth scan lines GWP2, GWN2, GIN2 and GWPN2 are connected to a second sub pixel group. In such an embodiment, the first pixel circuit part CC1 and second to fourth pixel circuit parts CC2, CC3, and CC4 are connected to the first to fourth scan lines GWP1, GWN1, GIN1, and GWPN1, and fifth to eighth pixel circuit parts CC5, CC6, CC7, and CC8 are connected to the fifth to eighth scan lines GWP2, GWN2, GIN2 and GWPN2.

The first to fourth scan lines GWP1, GWN1, GIN1, and GWPN1 extend in the first direction DR1 to overlap the first to fourth pixel circuit parts CC1 to CC4. A first scan line GWP1 connected to a second pixel group PG2 of an n-th row among the plurality of second pixel groups PG2 may be connected to an eighth scan line GWPN2 connected to a second pixel group PG2 of an (n−1)-th row. An eighth scan line GWPN2 connected to the second pixel group PG2 of the n-th row is connected to a first scan line GWP1 connected to a second pixel group PG2 of an (n+1)-th row.

A third scan line GIN1 connected to the second pixel group PG2 of the n-th row among the plurality of second pixel groups PG2 may be connected to a sixth scan line GWN2 connected to the second pixel group PG2 of the (n−1)-th row. A sixth scan line GWN2 connected to the second pixel group PG2 of the n-th row is connected to a third scan line GIN1 connected to the second pixel group PG2 of the (n+1)-th row.

A second scan line GWN1 connected to the second pixel group PG2 of the n-th row among the plurality of second pixel groups PG2 may be connected to a seventh scan line GIN2 connected to the second pixel group PG2 of the n-th row. A fourth scan line GWPN1 connected to the second pixel group PG2 of the n-th row is connected to a fifth scan line GWP2 connected to the second pixel group PG2 of the n-th row.

The third scan line GIN1 connected to the second pixel group PG2 of the n-th row is connected to the sixth scan line GWN2 connected to the second pixel group PG2 of the (n−1)-th row through a first bridge line BL1. The second scan line GWN1 connected to the second pixel group PG2 of the n-th row is connected to the seventh scan line GIN2 connected to the second pixel group PG2 of the n-th row through a second bridge line BL2.

The fourth scan line GWPN1 connected to the second pixel group PG2 of the n-th row is connected to the fifth scan line GWP2 connected to the second pixel group PG2 of the n-th row through a third bridge line BL3. The first scan line GWP1 connected to the second pixel group PG2 of the n-th row is connected to the eighth scan line GWPN2 connected to the second pixel group PG2 of the (n−1)-th row through a fourth bridge line BL4.

The fifth and seventh scan lines GWP2 and GIN2 connected to the second pixel group PG2 of each row may extend in the first direction DR1 to overlap an open area OA, of the plurality of open areas OA, positioned in a same row. In such an embodiment, the fifth and seventh scan lines GWP2 and GIN2 may be bent and extend along the lower edge of the open area OA.

The second and fourth scan lines GWN1 and GWPN1 connected to the second pixel group PG2 of each row may have a structure cut in the open area OA. In such an embodiment, the second and fourth scan lines GWN1 and GWPN1 may not overlap the open area OA. The second and fourth scan lines GWN1 and GWPN1 are connected to the seventh and fifth scan lines GIN2 and GWP2 connected to the second pixel group PG2 in the same row, through the second and third bridge lines BL2 and BL3, respectively.

In an embodiment, the sixth and eighth scan lines GWN2 and GWPN2 connected to the second pixel group PG2 of each row may have a structure cut in the open area OA. In such an embodiment, the sixth and eighth scan lines GWN2 and GWPN2 may not overlap the open area OA. The sixth and eighth scan lines GWN2 and GWPN2 are connected to the first and third scan lines GIN1 and GWP1 connected to the second pixel group PG2 in the next row, through the first and fourth bridge lines BL1 and BL4, respectively.

The display panel 211 may further include first and second light emission control lines EL1 and EL2 connected to a plurality of second pixel groups PG2, among the plurality of second pixel groups PG2, arranged in a same row. The first and second light emission control lines EL1 and EL2 may extend in the first direction DR1. The first light emission control line EL1 may be connected to the first sub pixel group, and the second light emission control line EL2 may be connected to the second sub pixel group. The first and second light emission control lines EL1 and EL2 may extend in the first direction DR1 to overlap an open area OA positioned in the same row. In such an embodiment, the first light emission control line EL1 may be bent and extend along the upper edge of the open area OA, and the second light emission control line EL2 may be bent and extend along the lower edge of the open area OA.

In such an embodiment, the area ratio of the open area OA may be improved by removing the second and fourth scan lines GWN1 and GWPN1 from the open area OA, and by removing the sixth and eighth scan lines GWN2 and GWPN2 of the n-th row from the open area OA, such that the light transmittance of the open area OA and the second display area DA2 may be improved. In such an embodiment, the light transmittance of the second display area DA2 is improved, such that the sensing sensitivity of the electronic modules 500 (illustrated in FIG. 1B) disposed below the second display area DA2 may be improved.

According to an embodiment of the invention, the sensing sensitivity of the electronic modules disposed below the second display area may be improved by reducing the number of the scan lines passing through the open area and by improving the light transmittance of the open area and the second display area.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:
1. A display panel comprising:
   a plurality of pixels disposed in the display area, wherein the plurality of pixels include n-th pixel circuits disposed in an n-th row and (n+1)-th pixel circuits disposed in an (n+1)-th row, wherein each of the n-th pixel circuits and the (n+1)-th pixel circuits includes a first transistor and a second transistor;
   a transmittance area disposed between a first portion of the n-th pixel circuits and a second portion of the n-th pixel circuits and between a third portion of the (n+1)-th pixel circuits and a fourth portion of the (n+1)-th pixel circuits;
   a first scan line connected to the first transistor included in the first portion of the n-th pixel circuits;
   a second scan line connected to the second transistor included in the third portion of the (n+1)-th pixel circuits; and
   a bridge line disposed between a first side edge of the transmittance area and the first portion and between the first side edge of the transmittance area and the third portion, the bridge line connecting the first scan line to the second scan line.
2. The display panel of claim 1, wherein
   the first and second scan lines do not overlap the transmittance area.
3. The display panel of claim 1, further comprising:
   a third scan line disposed bypassing the transmittance area,
   wherein the third scan line is connected to the second transistor included in the first portion of the n-th pixel circuits and the second transistor included in the second portion of the n-th pixel circuits.
4. The display panel of claim 3, wherein each of the n-th pixel circuits comprises:

a driving transistor including a first electrode connected to a first driving voltage, a second electrode electrically connected to an anode of a light emitting element, and a control electrode;

the first transistor including a first electrode connected to a data line, a second electrode connected to the first electrode of the first transistor, and a control electrode connected to the first scan line;

a compensating transistor including a first electrode connected to the second electrode of the first transistor, a second electrode connected to the control electrode of the first transistor, and a control electrode connected to the first scan line; and the second transistor including a first electrode connected to the control electrode of the first transistor, a second electrode connected to an initialization voltage line, and a control electrode connected to the third scan line.

5. The display panel of claim 1, wherein the bridge line is disposed on a layer different from a layer on which the first and second scan lines are disposed.

6. The display panel of claim 1, further comprising:
a first light emission control line connected to the n-th pixel circuits; and
a second light emission control line connected to the (n+1)-th pixel circuits,
wherein the first light emission control line extends along an upper edge of the transmittance areas, and
the second light emission control line extends along a lower edge of the transmittance area.

7. The display panel of claim 6, wherein the first and second light emission control lines do not overlap the transmittance area.

8. The display panel of claim 1, further comprising:
n-th light emitting elements connected to the n-th pixel circuits; and
(n+1)-th light emitting elements connected to the (n+1)-th pixel circuits.

9. The display panel of claim 1, wherein the display panel comprises a plurality of data lines connected to the n-th and (n+1)-th pixel circuits,
some of the data lines extend along the first side edge or a second side edge of the transmittance area.

10. The display panel of claim 9, wherein the data lines do not overlap the transmittance area.

11. The display panel of claim 1, wherein the display area includes a plurality of light emitting areas,
the transmittance area is disposed between two light emitting areas, among the plurality of light emitting areas, adjacent to each other in a first direction, and
the transmittance area is disposed between two light emitting areas, among the plurality of light emitting areas, adjacent to each other in a second direction crossing the first direction.

12. The display panel of claim 11, wherein the transmittance area does not overlap the plurality of light emitting areas.

13. The display panel of claim 11, wherein a size of the transmittance area is greater than that of each of the plurality of light emitting areas.

14. A display device comprising:
a display panel including transmittance area in display area; and
an electronic module overlapping the transmittance area of the display panel,
the display panel comprises:

a plurality of pixels disposed in the display area, wherein the plurality of pixels include n-th pixel circuits disposed in an n-th row and (n+1)-th pixel circuits disposed in an (n+1)-th row, wherein each of the n-th pixel circuits and the (n+1)-th pixel circuits includes a first transistor and a second transistor;

a transmittance area disposed between a first portion of the n-th pixel circuits and a second portion of the n-th pixel circuits and between a third portion of the (n+1)-th pixel circuits and a fourth portion of the (n+1)-th pixel circuits;

a first scan line connected to the first transistor included in the first portion of the n-th pixel circuits;

a second scan line connected to the second transistor included in the third portion of the (n+1)-th pixel circuits; and a bridge line disposed between a first side edge of the transmittance area and the first portion and between the first side edge of the transmittance area and the third portion, the bridge line connecting the first scan line to the second scan line.

15. The display device of claim 14, wherein
the first and second scan lines do not overlap the transmittance area.

16. The display device of claim 15, further comprising:
a third scan line disposed bypassing the transmittance area,
wherein the third scan line is connected to the second transistor included in the first portion of the n-th pixel circuits and the second transistor included in the second portion of the n-th pixel circuits.

17. The display device of claim 16, the bridge line is disposed on a layer different from a layer on which the first and second scan lines are disposed.

18. The display device of claim 14, further comprising:
a first light emission control line connected to the n-th pixel circuits; and
a second light emission control line connected to the (n+1)-th pixel circuits,
wherein the first light emission control line extends along an upper edge of the transmittance areas, and
the second light emission control line extends along a lower edge of the transmittance area.

19. The display device of claim 18, wherein the first and second light emission control lines do not overlap the transmittance area.

20. The display device of claim 16, wherein each of the n-th pixel circuits comprises:
a driving transistor including a first electrode connected to a first driving voltage, a second electrode electrically connected to an anode of a light emitting element, and a control electrode;
the first transistor including a first electrode connected to a data line, a second electrode connected to the first electrode of the first transistor, and a control electrode connected to the first scan line;
a compensating transistor including a first electrode connected to the second electrode of the first transistor, a second electrode connected to the control electrode of the first transistor, and a control electrode connected to the first scan line; and
the second transistor including a first electrode connected to the control electrode of the first transistor, a second electrode connected to an initialization voltage line, and a control electrode connected to the third scan line.

* * * * *